United States Patent
Ishii et al.

(10) Patent No.: US 9,893,055 B2
(45) Date of Patent: Feb. 13, 2018

(54) SEMICONDUCTOR DEVICE INCLUDING AN INSULATED GATE BIPOLAR TRANSISTOR AND A CIRCUIT CONFIGURED TO CONTROL THE INSULATED GATE BIPOLAR TRANSISTOR PROVIDED ON THE SAME SEMICONDUCTOR SUBSTRATE

(71) Applicant: FUJI ELECTRIC CO., LTD., Kawasaki-shi (JP)

(72) Inventors: Kenichi Ishii, Matsumoto (JP); Hiroshi Nakamura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/848,190

(22) Filed: Sep. 8, 2015

(65) Prior Publication Data

US 2015/0380401 A1    Dec. 31, 2015

Related U.S. Application Data

(63) Continuation of application No. PCT/JP2013/074593, filed on Sep. 11, 2013.

(51) Int. Cl.
*H01L 29/66* (2006.01)
*H01L 27/06* (2006.01)
(Continued)

(52) U.S. Cl.
CPC .......... *H01L 27/0635* (2013.01); *H01L 21/76* (2013.01); *H01L 27/0623* (2013.01);
(Continued)

(58) Field of Classification Search
CPC ....... H01L 21/76; H01L 29/739; H01L 29/78; H01L 27/088; H01L 27/0623;
(Continued)

(56) References Cited

U.S. PATENT DOCUMENTS

| 4,881,512 A | * | 11/1989 | Erskine | ................... | F02P 7/035 |
| | | | | | 123/628 |
| 5,356,827 A | | 10/1994 | Ohoka | | |

(Continued)

FOREIGN PATENT DOCUMENTS

| JP | H05-267439 A | 10/1993 |
| JP | H09-181315 A | 7/1997 |

(Continued)

*Primary Examiner* — Marc Armand
*Assistant Examiner* — Wilner Jean Baptiste
(74) *Attorney, Agent, or Firm* — Rabin & Berdo, P.C.

(57) ABSTRACT

A semiconductor device includes a first element portion including an IGBT and a second element portion including a circuit that controls the IGBT on the same semiconductor substrate. The novel structure reduces the size of the entire circuit and includes a drift region on a front surface of the substrate; a region in a surface layer of the drift region which is opposite to the substrate; an insulator layer that passes through the region in a depth direction and reaches the drift region, the insulator layer provided at a boundary between the first and second element portions, and separating the region into a first region in the first element portion and having the emitter potential of the IGBT and a second region in the second element portion; and a first contact electrode that contacts the second region, and that is electrically connected to an emitter electrode of the IGBT.

21 Claims, 23 Drawing Sheets

(51) Int. Cl.
  *H01L 21/76* (2006.01)
  *H01L 29/739* (2006.01)
  *H01L 29/78* (2006.01)
  *H01L 27/088* (2006.01)
  *H01L 49/02* (2006.01)
  *H01L 29/06* (2006.01)
  *H01L 29/08* (2006.01)
  *H01L 29/10* (2006.01)
  *H01L 29/417* (2006.01)

(52) U.S. Cl.
  CPC ............ *H01L 27/088* (2013.01); *H01L 28/20* (2013.01); *H01L 29/0649* (2013.01); *H01L 29/0804* (2013.01); *H01L 29/1095* (2013.01); *H01L 29/41708* (2013.01); *H01L 29/739* (2013.01); *H01L 29/7395* (2013.01); *H01L 29/78* (2013.01)

(58) Field of Classification Search
  CPC . H01L 29/7395; H01L 28/20; H01L 29/0649; H01L 29/0804; H01L 29/1095; H01L 29/41708
  USPC ......................................................... 257/140
  See application file for complete search history.

(56) References Cited

U.S. PATENT DOCUMENTS

| | | |
|---|---|---|
| 5,664,550 A | 9/1997 | Ito et al. |
| 5,798,538 A | 8/1998 | Nadd et al. |
| 2001/0042886 A1* | 11/2001 | Yoshida .............. H01L 27/0623 257/341 |
| 2002/0153586 A1 | 10/2002 | Majumdar et al. |
| 2004/0069289 A1* | 4/2004 | Ito .......................... F02P 3/0456 123/652 |
| 2005/0280078 A1 | 12/2005 | Teramae et al. |
| 2009/0108288 A1 | 4/2009 | Ozeki et al. |
| 2010/0059028 A1* | 3/2010 | Ueno ...................... F02P 3/051 123/652 |
| 2011/0012130 A1* | 1/2011 | Zhang ................. H01L 29/1095 257/77 |
| 2011/0133246 A1* | 6/2011 | Ueno ................. H01L 29/0696 257/140 |
| 2012/0068296 A1 | 3/2012 | Takaya et al. |
| 2012/0299108 A1* | 11/2012 | Harada .................. H01L 21/84 257/355 |

FOREIGN PATENT DOCUMENTS

| | | |
|---|---|---|
| JP | 11-201013 A | 7/1999 |
| JP | 3192074 B2 | 7/2001 |
| JP | 3216972 B2 | 10/2001 |
| JP | 2006-005248 A | 1/2006 |
| JP | 2009-124112 A | 6/2009 |
| JP | 2011-119542 A | 6/2011 |
| JP | 2012-023165 A | 2/2012 |
| WO | WO-2010/137158 A1 | 12/2010 |
| WO | WO-2011/024358 A1 | 3/2011 |

* cited by examiner

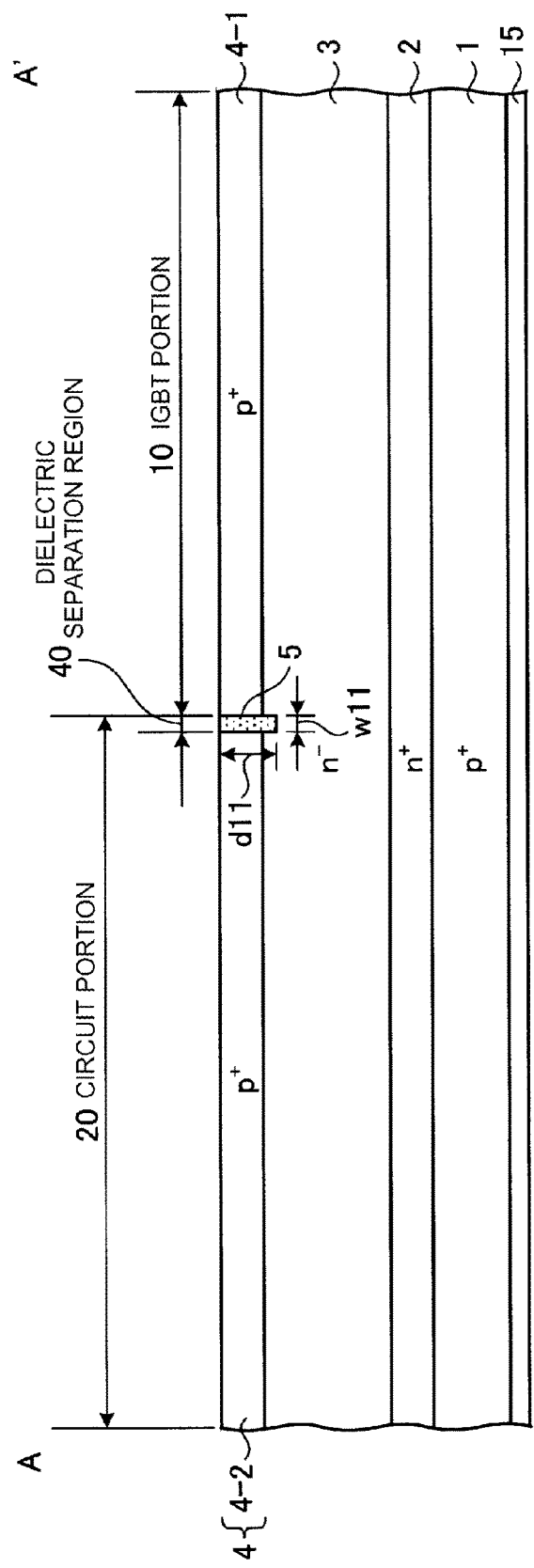

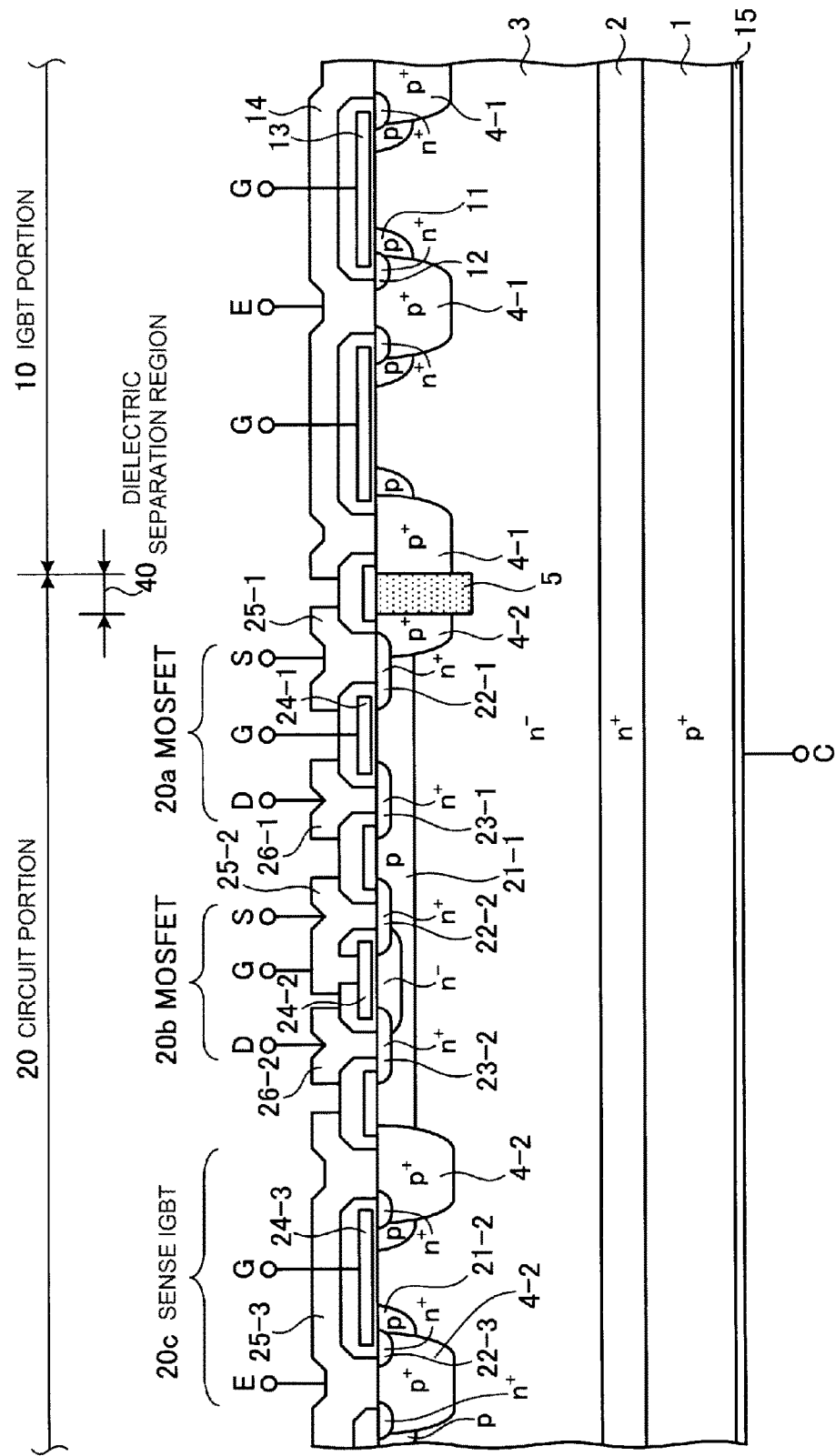

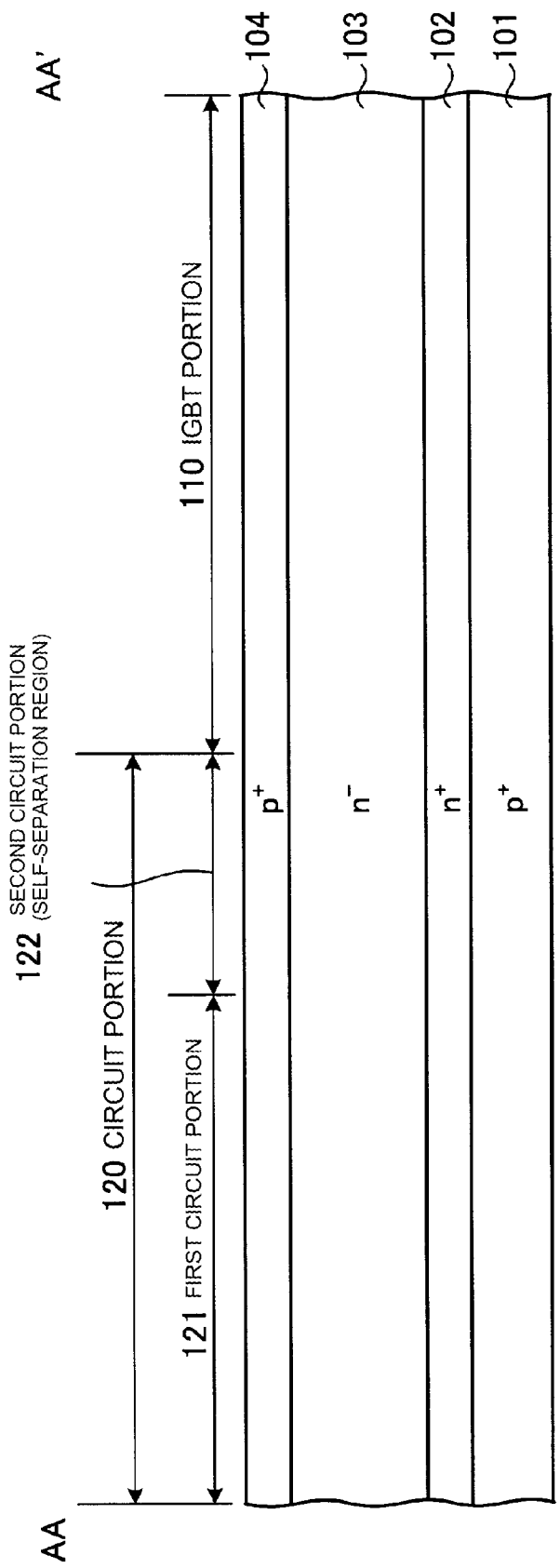

SEMICONDUCTOR DEVICE INCLUDING AN INSULATED GATE BIPOLAR TRANSISTOR AND A CIRCUIT CONFIGURED TO CONTROL THE INSULATED GATE BIPOLAR TRANSISTOR PROVIDED ON THE SAME SEMICONDUCTOR SUBSTRATE

CROSS-REFERENCE TO RELATED APPLICATION

This non-provisional application for a U.S. patent is a Continuation of International Application PCT/JP2013/074593 filed Sep. 11, 2013, the entire contents of which is hereby incorporated by reference.

BACKGROUND OF THE INVENTION

1. Field of the Invention

The present invention relates to a semiconductor device.

2. Background of the Related Art

A semiconductor device (igniter) which controls the flow of a low-voltage current to a primary coil of an ignition coil has been known as a structural portion of an internal-combustion engine ignition device which ignites an air-fuel mixture that is introduced into a combustion chamber of a gasoline engine used in, for example, a vehicle. In recent years, a one-chip igniter in which an insulated gate bipolar transistor (IGBT) forming a switch that controls the flow of a low-voltage current to the primary coil and a circuit portion for controlling the IGBT are provided on the same chip has been known as the igniter. The one-chip igniter according to the related art has a self-separation structure in which the IGBT and an element in the circuit portion are separated from each other by a predetermined distance and can be electrically separated from each other. The structure of the one-chip igniter with the self-separation structure according to the related art will be described in the following.

FIG. 14 is a plan view illustrating the planar layout of the one-chip igniter according to the related art. FIG. 15 is a cross-sectional view illustrating a cross-sectional structure taken along the cutting line AA-AA' of FIG. 14. As illustrated in FIGS. 14 and 15, the one-chip igniter according to the related art includes an IGBT portion 110, a circuit portion 120, and a breakdown voltage structure portion 130 which are formed in a semiconductor chip obtained by epitaxially growing an $n^+$ buffer region 102 and an $n^-$ drift region 103 in this order on a $p^+$ semiconductor substrate 101 and forming a plurality of $p^+$ regions 104 diffused in a surface layer of the $n^-$ drift region 103. In FIG. 15, the plurality of $p^+$ regions 104 are simplified and are illustrated as one $p^+$ region 104. The IGBT portion 110 and the circuit portion 120 are arranged in parallel at the center of the chip. For example, an IGBT forming a switch of an igniter is arranged in the IGBT portion 110.

The circuit portion 120 includes a first circuit portion 121 in which an active element, such as an insulated gate field effect transistor (MOSFET), is arranged and a second circuit portion 122 which functions as a self-separation region for electrically separating the IGBT in the IGBT portion 110 from each element in the first circuit portion 121. The second circuit portion 122 is arranged with a predetermined width (a width in the direction of the cutting line AA-AA') w0 between the IGBT portion 110 and the first circuit portion 121. As such, when the second circuit portion 122 is provided to separate the first circuit portion 121 from the IGBT portion 110, it is possible to reduce the value of the parasitic current of the IGBT in the IGBT portion 110 which flows from the IGBT portion 110 to the first circuit portion 121.

As such, when the second circuit portion 122 functions as a self-separation region, the adverse effect of the parasitic current of the IGBT in the IGBT portion 110 on each element in the first circuit portion 121 is suppressed and the surge resistance of the first circuit portion 121 is ensured. In order to effectively use the occupation area of the second circuit portion (hereinafter, referred to as a self-separation region) 122, a component which is not adversely affected by the parasitic current of the IGBT in the IGBT portion 110 among a plurality of components forming the circuit portion 120, that is, a component, such as a wiring line, an electrode pad, or a polysilicon device, which is provided over the front surface of the chip, with an oxide film interposed therebetween, and does not come into contact with a silicon portion is arranged in the self-separation region 122.

As a semiconductor device with a trench separation structure in which an IGBT portion and a circuit portion are arranged on the same chip, a device with a structure in which a deep trench is formed between an IGBT portion and a protective circuit portion and is filled with an insulator, for example, a silicon oxide film ($SiO_2$) has been proposed (for example, see JP 2011-119542 A (Patent Document 1). As disclosed in Patent Document 1, when the trench is formed so as to reach the vicinity of a $p^+$ collector region close to the anode, the effect of the structure is improved. This phenomenon is remarkable in a device in which a switching speed does not matter, particularly, in an engine ignition device. In addition, as the semiconductor device with the self-separation structure in which the IGBT portion and the circuit portion are arranged on the same chip, a device is proposed in which an IGBT and a control unit are substantially surrounded by a field terminal except for a narrow surface channel or a neck region (for example, see JP 9-181315 A (Patent Document 2).

However, in the one-chip igniter with the self-separation structure according to the related art, the occupation area of each component forming the circuit portion 120 can be reduced by, for example, a miniaturization technique and it is possible to reduce the area of the first circuit portion 121 according to the occupation area of the components. However, it is difficult to reduce the area of the self-separation region 122. Therefore, an invalid region in which no component is arranged and which has an area corresponding to the product of the width w0 (=about 800 μm) of the self-separation region 122 and the length of one side of the chip is generated in the circuit portion 120. That is, in the structure according to the related art, there are limitations in further reducing the size of the circuit portion 120 and it is difficult to reduce a chip size or costs.

In order to solve the above-mentioned problems of the related art, an object of the invention is to provide a semiconductor device which can reduce the size of a chip. In order to solve the above-mentioned problems of the related art, an object of the invention is to provide a semiconductor device which can reduce costs.

SUMMARY OF THE INVENTION

In order to solve the above-mentioned problems and achieve the objects of the invention, according to an aspect of the invention, there is provided a semiconductor device in which an insulated gate bipolar transistor and a circuit configured to control the insulated gate bipolar transistor are provided on the same semiconductor substrate. The semiconductor device has the following characteristics. A first element portion in which the insulated gate bipolar transistor is arranged is provided. A second element portion in which the circuit is arranged is provided. A second-conductivity-type drift region is provided on a front surface of the semiconductor substrate of a first conductivity type. A first-conductivity-type region is provided in a surface layer of the second-conductivity-type drift region which is opposite to the semiconductor substrate. An insulator layer that passes through the first-conductivity-type region in a depth direction and reaches the second-conductivity-type drift region is provided. The insulator layer is provided at a boundary between the first element portion and the second element portion. The insulator layer separates the first-conductivity-type region into a first first-conductivity-type region which is arranged in the first element portion and has an emitter potential of the insulated gate bipolar transistor and a second first-conductivity-type region which is arranged in the second element portion.

In the semiconductor device according to the above-mentioned aspect of the invention, the second first-conductivity-type region may come into contact with a base region of an insulated gate semiconductor element forming the circuit.

In the semiconductor device according to the above-mentioned aspect of the invention, the second first-conductivity-type region may surround the insulated gate semiconductor element.

The semiconductor device according to the above-mentioned aspect of the invention may further include a first contact electrode that comes into contact with the second first-conductivity-type region. The first contact electrode may be electrically connected to an emitter electrode of the insulated gate bipolar transistor.

The semiconductor device according to the above-mentioned aspect of the invention may further include a second contact electrode that is provided in an outer circumferential portion of the semiconductor substrate so as to surround the first element portion and the second element portion and has the emitter potential of the insulated gate bipolar transistor.

In the semiconductor device according to the above-mentioned aspect of the invention, an end of the insulator layer may extend from an end of the second first-conductivity-type region in an outer circumferential direction.

In the semiconductor device according to the above-mentioned aspect of the invention, an end of the insulator layer may be arranged inside an outer circumferential end of the second contact electrode.

In the semiconductor device according to the above-mentioned aspect of the invention, a distance from an end of the insulator layer which is close to the semiconductor substrate to an interface between the second-conductivity-type drift region and the semiconductor substrate may be equal to or greater than a diffusion length of a hole.

In the semiconductor device according to the above-mentioned aspect of the invention, a distance from an end of the insulator layer which is close to the semiconductor substrate to an interface between the second-conductivity-type drift region and the semiconductor substrate may be equal to or greater than half of the thickness of the second-conductivity-type drift region.

In the semiconductor device according to the above-mentioned aspect of the invention, a distance from an end of the insulator layer which is close to the semiconductor substrate to an interface between the second-conductivity-type drift region and the semiconductor substrate may be equal to or less than a diffusion length of a hole.

In the semiconductor device according to the above-mentioned aspect of the invention, a distance from an end of the insulator layer which is close to the semiconductor substrate to an interface between the second-conductivity-type drift region and the semiconductor substrate may be equal to or less than half of the thickness of the second-conductivity-type drift region.

The semiconductor device according to the above-mentioned aspect of the invention may further include a resistor that is connected between the second first-conductivity-type region and the first contact electrode.

In the semiconductor device according to the above-mentioned aspect of the invention, the semiconductor device may bean igniter and the insulated gate bipolar transistor may operate as a switch that controls the flow of a low-voltage current to a primary coil of an ignition coil.

According to the invention, a self-separation region is not provided at the boundary between the first element portion and the second element portion and the effect of suppressing a parasitic current and improving surge resistance to such a degree that a product standard is satisfied is obtained. It is possible to prevent a circuit in the second element portion from being broken. Therefore, it is possible to reduce the size of an invalid region in which no element is arranged, as compared to a case in which the first element portion and the second element portion are electrically separated from each other by the self-separation region.

According to the semiconductor device of the invention, it is possible to reduce the size of a chip. In addition, according to the semiconductor device of the invention, it is possible to reduce costs.

BRIEF DESCRIPTION OF DRAWINGS

FIG. 2 is a cross-sectional view schematically illustrating a cross-sectional structure taken along the cutting line A-A' of FIG. 1;

FIG. 3-1 is a cross-sectional view illustrating in detail the cross-sectional structure taken along the cutting line A-A' of FIG. 1;

FIG. 3-2 is an enlarged cross-sectional view illustrating the vicinity of a dielectric separation region illustrated in FIG. 3-1;

FIG. 3-3 is a cross-sectional view illustrating a modification of the dielectric separation region illustrated in FIG. 3-1;

FIG. 5-1 is a cross-sectional view illustrating the structure of a semiconductor device according to Embodiment 2;

FIG. 5-2 is a plan view illustrating the planar layout of an individual circuit provided in a circuit portion illustrated in FIG. 5-1 and the periphery thereof;

FIG. 5-3 is a plan view illustrating the planar layout of a sense IGBT provided in the circuit portion illustrated in FIG. 5-1 and the periphery thereof;

FIG. 8-1 is a cross-sectional view schematically illustrating a cross-sectional structure taken along the cutting line B-B' of FIG. 7;

FIG. 8-2 is a cross-sectional view schematically illustrating a cross-sectional structure taken along the cutting line C-C' of FIG. 7;

FIG. 8-3 is a cross-sectional view schematically illustrating a cross-sectional structure taken along the cutting line D-D' of FIG. 7;

FIG. 8-4 is a circuit diagram illustrating the circuit structure of a general internal-combustion engine ignition device;

FIG. 8-5 is a diagram illustrating the internal operation of the semiconductor device according to Embodiment 3;

FIG. 8-6 is a diagram illustrating the internal operation of a semiconductor device according to the related art;

FIG. 15 is a cross-sectional view illustrating a cross-sectional structure taken along the cutting line AA-AA' of FIG. 14.

DETAILED DESCRIPTION OF THE INVENTION

Figure 1:
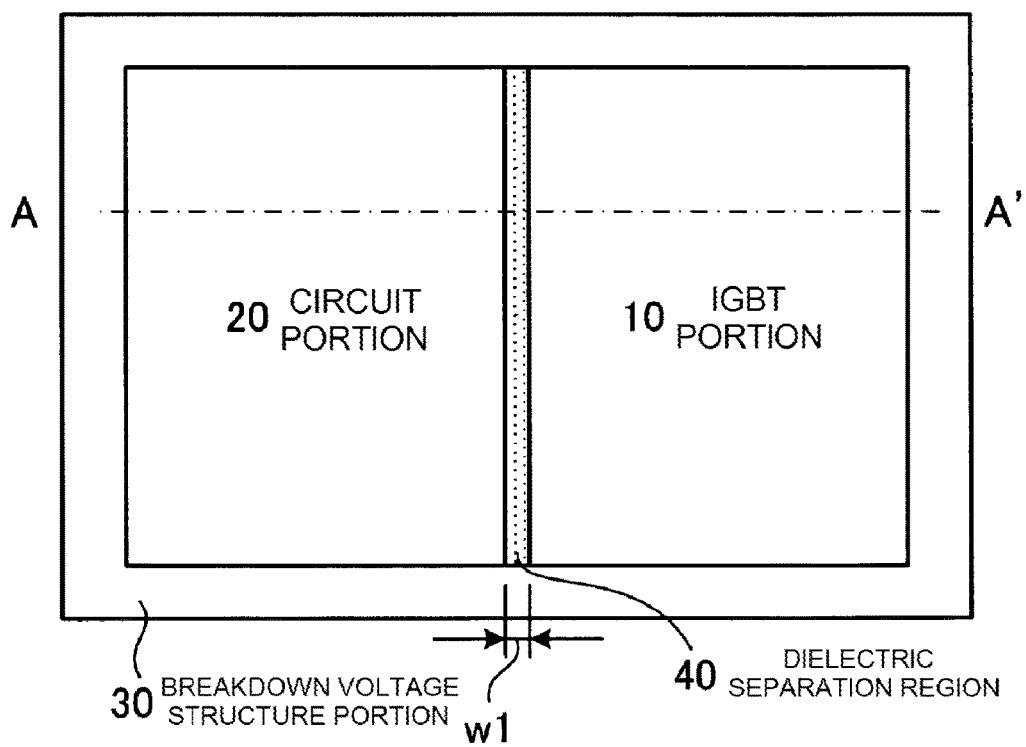
FIG. 1 is a plan view illustrating the planar layout of a semiconductor device according to Embodiment 1.

Hereinafter, preferred embodiments of a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

Embodiment 1

Figures 2, 3:
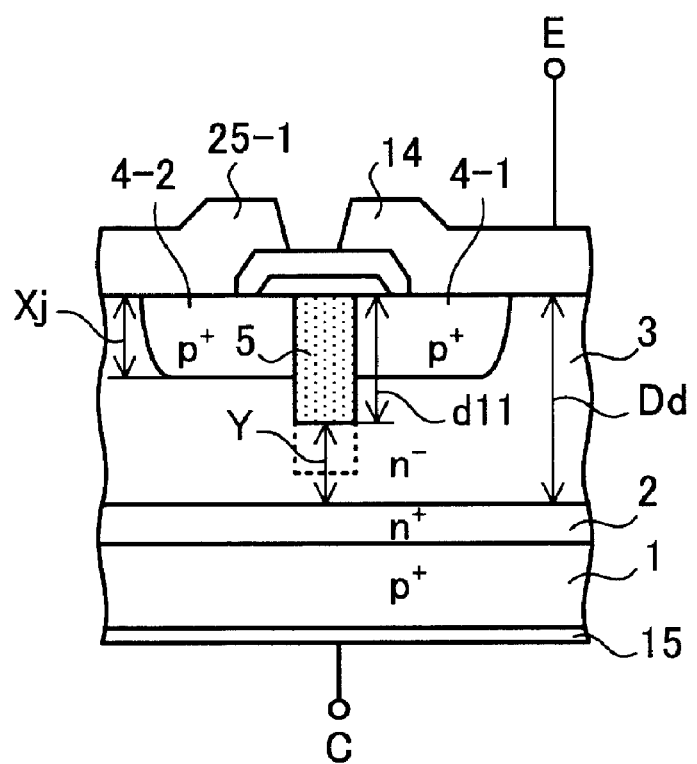
Figure 3:
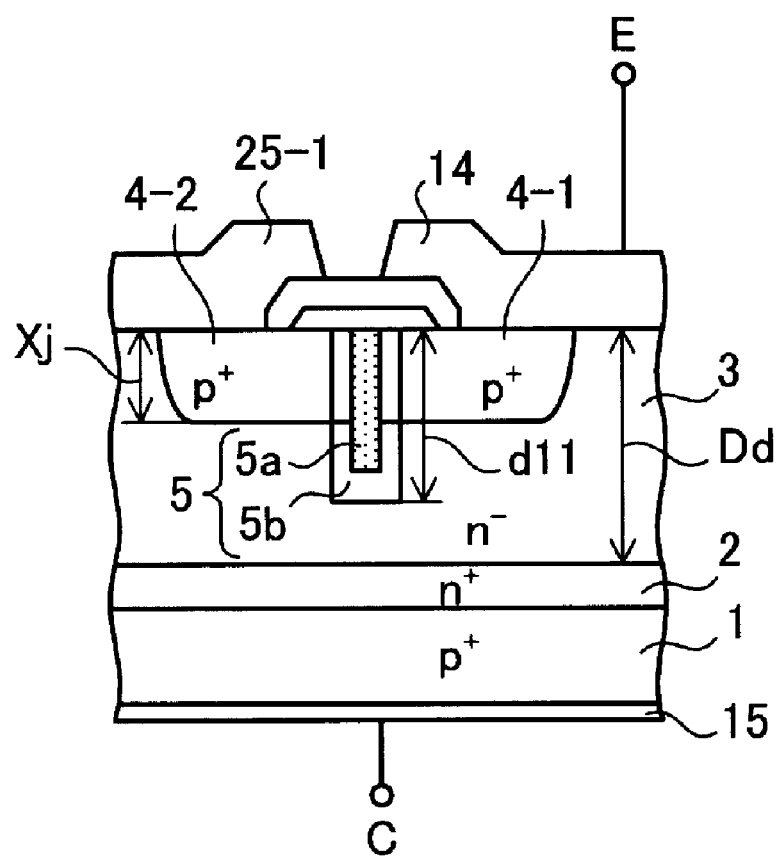

A semiconductor device in which an IGBT and a circuit portion for controlling the IGBT are provided on the same chip will be described as an example of the structure of a semiconductor device according to Embodiment 1. FIG. 1 is a plan view illustrating the planar layout of the semiconductor device according to Embodiment 1. FIG. 2 is a cross-sectional view schematically illustrating a cross-sectional structure taken along the cutting line A-A' of FIG. 1. FIG. 3-1 is a cross-sectional view illustrating in detail the cross-sectional structure taken along the cutting line A-A' of FIG. 1. In FIG. 2, an element structure which is formed on the front surface side of the chip is not illustrated. As illustrated in FIG. 1, in the semiconductor device according to Embodiment 1, an IGBT portion (first element portion) 10 in which the IGBT is arranged and a circuit portion (second element portion) 20 in which a plurality of elements forming a circuit for controlling the IGBT in the IGBT portion 10 are arranged are provided on the same semiconductor chip.

The IGBT portion 10 and the circuit portion 20 are arranged in parallel at the center of the chip. A plurality of components (not illustrated) forming the circuit portion 20 are arranged in the circuit portion 20. The plurality of components forming the circuit portion 20 include, for example, an active element, such as a sense IGBT or a MOSFET, a wiring line, an electrode pad, and a polysilicon (Poly-Si) device. In addition, a dielectric separation region 40 which electrically separates each element in the circuit portion 20 from the IGBT in the IGBT portion 10 is provided in a portion of the circuit portion 20 which borders the IGBT portion 10. For example, the dielectric separation region 40 is formed by filling a trench, which is provided at a depth that does not pass through an n⁻ drift region (not illustrated) in a depth direction from the front surface of the chip, with an insulator or polysilicon with a floating potential. The width (a width in the direction of the cutting line A-A') w1 of the dielectric separation region 40 varies depending on the material buried in the trench.

For example, when the trench is filled with a silicon oxide film, the width w1 of the dielectric separation region 40 is, for example, equal to or greater than about 1 µm and equal to or less than about 5 µm. When the trench is not completely filled with the silicon oxide film, but polysilicon (non-doped) is provided inside the silicon oxide film, equipotential lines are likely to be spread, as compared to a case in which the trench is completely filled with the silicon oxide film, since the permittivity of silicon is higher than that of the silicon oxide film. Therefore, the width w1 of the dielectric separation region 40 is preferably in the range of, for example, about 3 µm to 20 µm, considering that the equipotential lines are likely to be spread. As a result, the width w1 of the dielectric separation region 40 is preferably equal to or less than about 100 µm. The reason is that it is preferable to minimize an invalid region in which no element is arranged. A breakdown voltage structure portion 30 is provided in the outer circumference of the chip so as to surround the IGBT portion 10 and the circuit portion 20.

As illustrated in FIGS. 2 and 3-1, for example, a semiconductor chip forming the semiconductor device according to Embodiment 1 is formed by epitaxially growing an n⁺ buffer region 2 and an n⁻ drift region 3 on a p⁺ semiconductor substrate 1, which will be a p⁺ collector, in this order. A p⁺ region 4 is provided in a surface layer of the front surface (a surface close to the n⁻ drift region 3) of the semiconductor chip so as to extend from the IGBT portion 10 to the circuit portion 20. However, in practice, as illustrated in FIG. 3-1, in the IGBT portion 10, a plurality of p⁺ regions 4 are provided in the surface layer of the front surface of the semiconductor chip. In the circuit portion 20, a dielectric separation layer (insulator layer) 5 is provided at the boundary with the IGBT portion 10 at a depth d11 that reaches the n⁻ drift region 3 from the front surface of the chip through the p⁺ region (first-conductivity-type region) 4 and forms the dielectric separation region 40. That is, the dielectric separation layer 5 separates the p⁺ region 4 into a first p⁺ region (first first-conductivity-type region) 4-1 in the IGBT portion 10 and a second p⁺ region (second first-conductivity-type region) 4-2 in the circuit portion 20.

The dielectric separation layer 5 is made of, for example, an insulator without a potential, polysilicon with a floating potential, or a combination thereof (for example, a groove in which an insulator having polysilicon buried therein is provided). The dielectric separation layer 5 is linearly arranged in a portion of the circuit portion 20 which borders the IGBT portion 10 so as to separate the circuit portion 20 from the IGBT portion 10. The dielectric separation layer 5 may be provided at the depth d11 that passes through at least the first and second p$^+$ regions 4-1 and 4-2. Preferably, the dielectric separation layer 5 is provided at a depth that reaches the p$^+$ semiconductor substrate 1 through the first and second p$^+$ regions 4-1 and 4-2, the n$^-$ drift region 3, and the n$^+$ buffer region 2. Specifically, the depth d11 of the dielectric separation layer 5 may be generally, for example, equal to or greater than about 10 μm and equal to or less than about 100 μm. The width w11 of the dielectric separation layer 5 may be, for example, about 10 μm.

In FIG. 1, on the front surface side of the chip, the dielectric separation layer 5 is arranged such that the IGBT portion 10 and the circuit portion 20 do not come into contact with each other and electrically separates the circuit portion 20 from the IGBT portion 10. However, the dielectric separation layer 5 may block a parasitic current of the IGBT in the IGBT portion 10, which flows from the IGBT portion 10 to the circuit portion 20, such that each element in the circuit portion 20 is not broken by the parasitic current of the IGBT in the IGBT portion 10 and the potential of the circuit portion 20 (for example, the back-gate potential of a MOSFET or a sense IGBT forming the circuit portion 20) does not float from the lowest potential (for example, a ground potential; hereinafter, referred to as a ground potential) of the semiconductor device. The IGBT portion 10 and the circuit portion 20 may share potential. That is, the first p$^+$ region 4-1 and the second p$^+$ region 4-2 may selectively come into contact with each other at the boundary between the IGBT portion 10 and the circuit portion 20. The reason is as follows.

For example, when the IGBT in the IGBT portion 10 is used as a switch of an igniter, a current flows to the IGBT in the IGBT portion 10 due to an on signal from an engine control unit (ECU) and the IGBT in the IGBT portion 10 is turned off by an off signal from the ECU. When the IGBT in the IGBT portion 10 is turned off, a voltage of about 300 V is generated by a primary coil of an ignition coil, which causes the generation of a voltage of about 30 kV by a secondary coil. As a result, a spark plug generates an ignition spark. Therefore, the IGBT in the IGBT portion 10 may have the performance of a switch. In addition, the IGBT in the IGBT portion 10 may be turned on or off by each element of the circuit portion 20. In this case, it is possible to obtain desired electrical characteristics satisfying a product standard when the parasitic current of the IGBT in the IGBT portion 10 can be blocked such that each element in the circuit portion 20 is not broken and the potential of the circuit portion 20 does not float from the ground potential. In addition, the first p$^+$ region 4-1 and the second p$^+$ region 4-2 may selectively come into contact with each other. Therefore, flexibility in the design is improved. A wiring line made of, for example, aluminum (Al) may be provided on the surface of the dielectric separation layer 5 if it is possible in a manufacturing process.

In the IGBT portion 10, a MOS gate structure including the first p$^+$ region 4-1, a p-type base region 11, an n$^+$ emitter region 12, and a gate electrode 13 and a front surface element structure of the IGBT with a general structure including an emitter electrode 14 are provided on the front surface side of the chip. Specifically, for example, the IGBT of the IGBT portion 10 includes the p-type base region 11 provided in a portion which has the first p$^+$ region 4-1 as a contact region and in which the first p$^+$ region 4-1 is not selectively provided, that is, a portion in which the n$^-$ drift region 3 that is a layer (a layer close to the p$^+$ semiconductor substrate 1) below the first p$^+$ region 4-1 reaches the front surface of the chip.

In the portion in which the n$^-$ drift region 3 reaches the front surface of the chip, the p-type base region 11 is selectively provided in the surface layer of the front surface of the chip so as to come into contact with the first p$^+$ region 4-1. The n$^+$ emitter region 12 is provided in the p-type base region 11 so as to come into contact with the first p$^+$ region 4-1. The gate electrode 13 is provided over a surface of a portion of the p-type base region 11 which is interposed between the n$^-$ drift region 3 and the n$^+$ emitter region 12, with a gate insulating film interposed between. The emitter electrode 14 comes into contact with the p-type base region 11, the n$^+$ emitter region 12, and the p$^+$ region 4-1. A collector electrode 15 is provided on the entire rear surface of the semiconductor chip.

In the circuit portion 20, a plurality of MOSFETs 20a and 20b with a general structure including, for example, n$^+$ source regions 22-1 and 22-2, n$^+$ drain regions 23-1 and 23-2, gate electrodes 24-1 and 24-2, source electrodes 25-1 and 25-2, and drain electrodes 26-1 and 26-2 are provided on the front surface side of the chip. The MOSFET 20a is an enhancement MOSFET and the MOSFET 20b is a depression MOSFET. Specifically, for example, the MOSFETs 20a and 20b in the circuit portion 20 is provided in a portion in which the second p$^+$ region 4-2 is not selectively provided, that is, a portion in which the n$^-$ drift region 3 below the second p$^+$ region 4-2 reaches the front surface of the chip. In the portion in which the n$^-$ drift region 3 reaches the front surface of the chip, a p-type base region 21-1 is provided in the surface layer of the front surface of the chip.

The n$^+$ source regions 22-1 and 22-2 and the n$^+$ drain regions 23-1 and 23-2 are selectively provided in the p-type base region 21-1. The gate electrode 24-1 is provided over a surface of a portion of the p-type base region 21-1 which is interposed between the n$^+$ source region 22-1 and the n$^+$ drain region 23-1, with the gate insulating film interposed therebetween, and the gate electrode 24-2 is provided over a surface of a portion of the p-type base region 21-1 which is interposed between the n$^+$ source region 22-2 and the n$^+$ drain region 23-2, with the gate insulating film interposed therebetween. The source electrodes 25-1 and 25-2 come into contact with the n$^+$ source regions 22-1 and 22-2, respectively. The drain electrodes 26-1 and 26-2 come into contact with the n$^+$ drain regions 23-1 and 23-2, respectively. In the depression MOSFET 20b, an n$^-$ region having a lower impurity concentration than the n$^+$ source region 22-2 and the n$^+$ drain region 23-2 is provided between the n$^+$ source region 22-2 and the n$^+$ drain region 23-2 so as to come into contact with the n$_+$ source region 22-2 and the n$^+$ drain region 23-2.

In the circuit portion 20, a front surface element structure of a sense IGBT 20c including an emitter electrode 25-3 and a MOS gate structure having the second p$^+$ region 4-2, the p-type base region 21-2, an n$^+$ emitter region 22-3, and a gate electrode 24-3 is provided on the front surface side of the chip. Specifically, for example, the sense IGBT 20c in the circuit portion 20 includes the p-type base region 21-2 provided in a portion which has the second p$^+$ region 4-2 as a contact region and in which the second p$^+$ region 4-2 is not selectively provided, that is, a portion in which the n$^-$ drift region 3 below the second p$^+$ region 4-2 reaches the front surface of the chip. The sense IGBT 20c has the same structure as the IGBT in the IGBT portion 10. That is, in the sense IGBT 20c and the IGBT of the IGBT portion 10, the n$^+$ emitter regions and the p-type base regions have the same diffusion depth or the same impurity concentration distribution and the gate oxide films have the same thickness. Therefore, in the sense IGBT 20c, the threshold value of the gate is the same as the threshold value of the gate of the IGBT in the IGBT portion 10.

It is preferable that the sense IGBT 20c be a predetermined distance away from the IGBT in the IGBT portion 10. The reason is as follows. The sense IGBT 20c detects a current which flows below the sense IGBT 20c (on the side close to the $p^+$ semiconductor substrate 1). Therefore, when the distance between the sense IGBT 20c and the IGBT in the IGBT portion 10 is short and the parasitic current of the IGBT in the IGBT portion 10 flows below the sense IGBT 20c, it is difficult for the sense IGBT 20c to accurately measure the current. In general, the sense IGBT is provided in the IGBT in the IGBT portion 10. However, in this case, when products which have the same structure and in which the IGBTs in the IGBT portions 10 have different current ratings are manufactured (produced), it is difficult to use sense IGBTs with the same setting conditions. That is, when a current value which can be detected by the sense IGBT is limited to a constant value regardless of the current rating of the IGBT in the IGBT portion 10, it is necessary to review the design conditions of the sense IGBT whenever the current rating of the IGBT in the IGBT portion 10 is changed and it takes a lot of time to design the layout of the circuit. As described above, when the sense IGBT is arranged at the position that is away from the IGBT in the IGBT portion 10, it is possible to reduce the possibility of the design conditions of the sense IGBT being adjusted depending on the current rating of the IGBT in the IGBT portion 10. For example, the distance of the sense IGBT 20c from the boundary between the IGBT portion 10 and the dielectric separation region 40 is equal to or greater than 1000 μm and preferably equal to or greater than 1500 μm. In this case, it is possible to manufacture products with different current ratings, using the sense IGBTs with substantially the same design conditions, regardless of the current rating of the IGBT in the IGBT portion 10.

The sense IGBT 20c may be arranged so as to be away from an outer circumferential portion of the chip, specifically, the boundary between the circuit portion 20 and the breakdown voltage structure portion 30. The reason is as follows. When the side surface of the chip is cut during dicing, the crystalline state of silicon in the outer circumferential portion of the chip is rough. As a result, a carrier is likely to be generated and it is difficult to accurately measure a sense current.

In the circuit portion 20, a wiring line, an electrode pad, or a polysilicon device is provided over the front surface of the chip, with an oxide film interposed therebetween. In the circuit portion 20, the second $p^+$ region 4-2 may be provided around active elements, such as the MOSFETs 20a and 20b and the sense IGBT 20c, or in the surface layer of the front surface of the chip which faces the wiring line, the electrode pad, or the polysilicon device, with the oxide film interposed therebetween. That is, in the circuit portion 20, it is preferable that the second $p^+$ region 4-2 be provided substantially in the entire surface of a portion other than the portion in which MOSFETs (including the MOSFETs 20a and 20b) are provided in the surface layer of the front surface of the chip. In a case in which a plurality of second $p^+$ regions 4-2 dot the circuit portion 20, when the second $p^+$ regions 4-2 are electrically connected to each other, it is easy to test the product, which is preferable.

Next, the characteristics and modifications of the structure of the dielectric separation region 40 will be described. FIG. 3-2 is an enlarged cross-sectional view illustrating the vicinity of the dielectric separation region illustrated in FIG. 3-1. FIG. 3-3 is a cross-sectional view illustrating a modification of the dielectric separation region illustrated in FIG. 3-1. In FIGS. 3-2 and 3-3, an $n^+$ diffusion region (for example, an $n^+$ source region) provided in the front surface of the chip is not illustrated. As described above, the depth d11 of the dielectric separation layer 5 (from the front surface of the chip) is larger than the diffusion depth Xj of the first $p^+$ region 4-1 or the second $p^+$ region 4-2 (d11>Xj). In particular, the depth d11 of the dielectric separation layer 5 can reduce the number of holes, which are injected from the $p^+$ semiconductor substrate 1 that will be a $p^+$ collector region to the $n^-$ drift region 3 and then moved into the circuit portion 20 when the IGBT in the IGBT portion 10 is turned on, to a level that does not affect the actual use of the device. The bottom of the dielectric separation layer 5 may reach the $p^+$ semiconductor substrate 1. When the bottom of the dielectric separation layer 5 reaches the $p^+$ semiconductor substrate 1, the throughput of a trench etching process is reduced since the depth d11 of the dielectric separation layer 5 is greater than, for example, 20 μm.

Therefore, it is preferable that the bottom of the dielectric separation layer 5 be closer to the $p^+$ semiconductor substrate 1 than a position which is away from the pn junction between the $p^+$ semiconductor substrate 1 to the $n^+$ buffer region 2 to the front surface of the chip by a diffusion length Lp of the hole. The effect of the invention is sufficiently obtained when the depth of the bottom of the dielectric separation layer 5 from the front surface of the chip (the depth d11 of the dielectric separation layer 5) is greater than a value obtained by subtracting the diffusion length Lp of the hole from the depth from the front surface of the chip to the pn junction between the $p^+$ semiconductor substrate 1 and the $n^+$ buffer region 2 (the total thickness of the $n^-$ drift region 3 and the $n^+$ buffer region 2). That is, a distance Y from the bottom of the dielectric separation layer 5 to the $n^+$ buffer region 2 may be equal to or less than the diffusion length Lp of the hole (Y≤Lp).

The reason why the distance from the bottom of the dielectric separation layer 5 to the $n^+$ buffer region 2 is used is that the concentration of holes injected from the $p^+$ semiconductor substrate 1 is reduced in the $n^+$ buffer region 2 by charge neutrality conditions and is then increased in the $n^-$ drift region 3. Therefore, the movement of the holes into the circuit portion 20 is affected by the relationship between the position (depth) of the bottom of the dielectric separation layer 5 and the depth (that is, the thickness Dd of the $n^-$ drift region 3) from the front surface of the chip to the interface between the $n^-$ drift region 3 and the $n^+$ buffer region 2.

For example, in a case in which a defect occurs in the $n^-$ drift region 3 due to, for example, electron beam irradiation and the lifetime of electrons and holes is reduced, when the IGBT in the IGBT portion 10 is in an on state and the conductivity of the $n^-$ drift region 3 is modulated, the concentration of stored charges in the depth direction has the minimum value substantially in a middle portion of the $n^-$ drift region 3. Therefore, the distance Y from the bottom of the dielectric separation layer 5 to the $n^+$ buffer region 2 may be less than half (=0.5 Dd) of the thickness Dd of the $n^-$ drift region 3 (Y<0.5 Dd).

When 0.5 Dd is different from the diffusion length Lp of the hole, for example, the distance Y from the bottom of the dielectric separation layer 5 to the $n^+$ buffer region 2 may be greater than 0.5 Dd or the diffusion length Lp of the hole (for example, the smaller of them) (0.5 Dd<Y≤Lp or Lp<Y≤0.5 Dd) and less than a value (=Dd−Xj) obtained by subtracting the diffusion depth Xj of the first p$^+$ region 4-1 or the second p$^+$ region 4-2 from the thickness Dd of the n$^-$ drift region 3 (Y<Dd−Xj).

As described above, a distance Y of 0.5 Dd from the bottom of the dielectric separation layer 5 to the n$^+$ buffer region 2 is enough when the diffusion length Lp of the hole is less than 0.5 Dd (Y=0.5 Dd) and the diffusion length Lp of the hole is enough as the distance Y when 0.5 Dd is less than the diffusion length Lp of the hole (Y=Lp). That is, even when the distance Y from the bottom of the dielectric separation layer 5 to the n$^+$ buffer region 2 is greater than the smaller of 0.5 Dd and the diffusion length Lp of the hole, the effect of suppressing the movement of carriers (holes) into the circuit portion 20 is obtained. The holes are moved from the n$^-$ drift region 3 to the first p$^+$ region 4-1 or the second p$^+$ region 4-2 and flow to the emitter electrode 14 or an electrode connected to the emitter electrode 14. Therefore, the bottom of the dielectric separation layer 5 may be deeper than the first p$^+$ region 4-1 or the second p$^+$ region 4-2. As a result, when 0.5 Dd≤Lp is satisfied, the distance Y from the bottom of the dielectric separation layer 5 to the n$^+$ buffer region 2 may be equal to or less than the diffusion length Lp of the hole, equal to or greater than 0.5 Dd, and less than (Dd−Xj). Alternatively, when Lp<0.5 Dd is satisfied, the distance Y from the bottom of the dielectric separation layer 5 to the n$^+$ buffer region 2 may be equal to or less than 0.5 Dd, equal to or greater than the diffusion length Lp of the hole, and less than (Dd−Xj).

As a modification of the dielectric separation layer 5, as illustrated in FIG. 3-3, a dielectric layer (for example, an oxide film) 5a is formed on the inner wall of a trench and non-doped polysilicon 5b is buried inside the dielectric layer 5a. The IGBT portion 10 and the circuit portion 20 are separated from each other by a dielectric in order to physically block the flow of holes from the collector layer to the circuit portion 20. For this reason, it is preferable that the dielectric separation layer 5 be not electrically active, but be inactive, that is, have a floating potential. Therefore, the non-doped polysilicon 5b is preferably buried inside the dielectric layer 5a which is provided on the inner wall of the trench.

As illustrated in FIG. 3-1, the dielectric separation layer 5 does not necessarily come into contact with the first p$^+$ region 4-1 or the second p$^+$ region 4-2. The dielectric separation layer 5 may be arranged so as to be separated from the first p$^+$ region 4-1 or the second p$^+$ region 4-2. In the IGBT portion 10, a unit cell includes the first p$^+$ region 4-1 (p well). Therefore, when the dielectric separation layer 5 is not separated from the first p$^+$ region 4-1, but comes into contact with the first p$^+$ region 4-1, the size of the invalid region is reduced by a value corresponding to the gap between the dielectric separation layer 5 and the first p$^+$ region 4-1 and it is possible to reduce the area of the chip. In addition, in the circuit portion 20, when the dielectric separation layer 5 comes into contact with the second p$^+$ region 4-2 and the second p$^+$ region 4-2 is electrically connected to an electrode with an emitter potential, it is possible to draw the holes in the vicinity of the dielectric separation layer 5. Therefore, it is possible to suppress the latch-up of the circuit portion 20.

Figure 4:
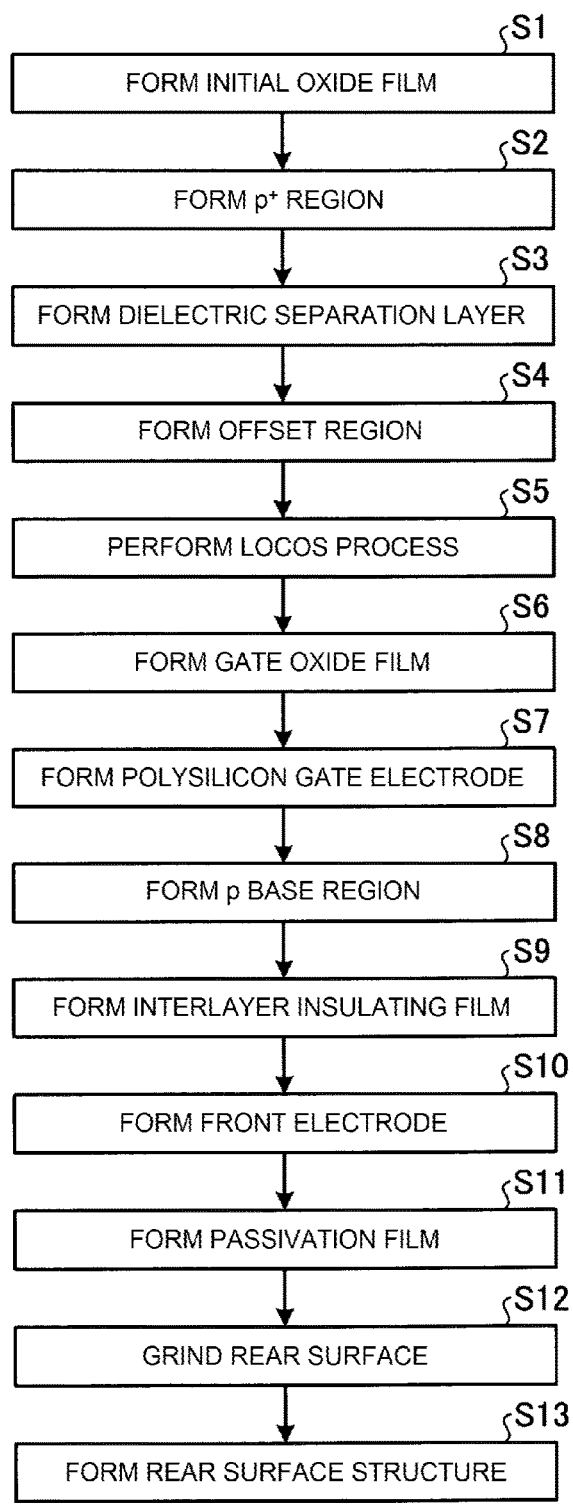
FIG. 4 is a flowchart illustrating the outline of a method for manufacturing the semiconductor device according to Embodiment 1.

Next, a method for manufacturing the semiconductor device according to Embodiment 1 will be described. FIG. 4 is a flowchart illustrating the outline of the method for manufacturing the semiconductor device according to Embodiment 1. First, the n$^+$ buffer region 2 and the n$^-$ drift region 3 are epitaxially grown in this order on the front surface of the p$^+$ semiconductor substrate 1, which will be the p$^+$ collector region, to form an epitaxial substrate (epitaxial wafer). Then, an initial oxide film is formed on the front surface (a surface close to the n$^-$ drift region 3) of the epitaxial substrate by, for example, thermal oxidation (Step S1). Then, the initial oxide film is patterned to form an oxide film mask in which a portion corresponding to a region for forming the p$^+$ region 4 is opened.

Then, p-type impurity ions are implanted using the oxide film mask as a mask and a heat treatment (well drive) is performed to activate the p-type impurities, thereby forming the p$^+$ region 4 (Step S2). Then, the oxide film mask is removed and a new oxide film is formed. Then, a trench etching oxide film mask in which a portion corresponding to a dielectric separation region 40 is opened is formed by photolithography and etching. Then, a trench which reaches the n$^-$ drift region 3 through the p$^+$ region 4 is formed using the trench etching oxide film mask as a mask. The trench may have any cross-sectional shape as long as the p$^+$ region 4 can be separated by the trench. In addition, in the trench etching oxide film mask, the oxide film may be replaced with a nitride film. Then, the resist mask which is used to form the trench is removed and an insulator layer, such as an oxide film, is deposited on the front surface of the substrate so as to fill up the trench.

Then, the insulator layer on the front surface of the substrate is removed and the front surface is planarized such that the insulator layer remains only in the trench. In this way, the dielectric separation layer 5 obtained by filling the trench with the insulator layer is formed (Step S3). In Step S3, since the insulator layer on the front surface of the substrate is removed and the front surface is planarized, it is possible to provide a semiconductor substrate with a flat front surface and a flat rear surface. Therefore, it is possible to perform the subsequent steps using a general manufacturing process. That is, since the dielectric separation layer 5 is formed in the semiconductor substrate before the IGBT in the IGBT portion 10 or each element in the circuit portion 20 is formed, it is possible to manufacture a semiconductor device, using the same process as that in the related art, without adding a special process.

In addition, since the dielectric separation layer 5 is formed in the semiconductor substrate before the IGBT in the IGBT portion 10 or each element in the circuit portion 20 is formed, there is no adverse effect on the electrical characteristics of the IGBT in the IGBT portion 10 or each element in the circuit portion 20. In addition, since the trench is filled with the dielectric separation layer 5 before the IGBT in the IGBT portion 10 or each element in the circuit portion 20 is formed, it is possible to prevent an etching residue from remaining in the trench in the subsequent processes. In Step S3, the trench may be filled with non-doped polysilicon, instead of the insulator layer. The p$^+$ region 4 is separated into the first p$^+$ region 4-1 in the IGBT portion 10 and the second p$^+$ region 4-2 in the circuit portion 20 by the dielectric separation layer 5.

Then, a resist mask in which a portion corresponding to a region for forming an offset region for reducing the electric field that is concentrated on the p-type base region 21-1 in the circuit portion 20 is opened is formed by photolithography and etching. Then, n-type or p-type impurity ions are implanted using the resist mask as a mask and a heat treatment (offset drive) is performed to activate the impurities, thereby forming an n-type or p-type offset region (not illustrated) (Step S4).

Then, the resist mask used to form the offset region is removed and a local oxidation of silicon (LOCOS) film is formed between elements in the IGBT portion 10 and between elements in the circuit portion 20 by a LOCOS process (Step S5). Then, a gate oxide film is formed on the front surface of the substrate (Step S6). Then, a non-doped polysilicon film is deposited on the gate oxide film. Then, the semiconductor substrate is exposed to, for example, a phosphoryl chloride ($POCL_3$) gas atmosphere to change the conductivity type of the polysilicon film deposited on the front surface of the substrate to an n type. A method for forming the n-type doped polysilicon film is not limited thereto. For example, n-type doped polysilicon may be deposited to form the n-type doped polysilicon film.

Then, the polysilicon film is patterned to form, for example, the gate electrode 13 of the IGBT in the IGBT portion 10, the gate electrodes 24-1 and 24-2 of the MOSFETs 20a and 20b, and the gate electrode 24-3 of the sense IGBT 20c (Step S7). Then, p-type impurity ions are implanted, using the gate electrodes 13, 24-1 and 24-2, and 24-3 as a mask, and a heat treatment (channel drive) is performed to activate the p-type impurities, thereby forming channel regions, such as the p-type base region 11 of the IGBT in the IGBT portion 10, the p-type base region 21-2 of the sense IGBT 20c in the circuit portion 20, and the p-type base region 21-1 of the MOSFETs 20a and 20b in the circuit portion 20 (Step S8).

Then, a resist mask in which portions corresponding to regions for forming the $n^+$ emitter region 12 of the IGBT in the IGBT portion 10, the $n^+$ emitter region 22-3 of the sense IGBT 20c in the circuit portion 20, and the $n^+$ source regions 22-1 and 22-2 or the $n^+$ drain regions 23-1 and 23-2 of the MOSFETs 20a and 20b in the circuit portion 20 are opened is formed by photolithography and etching. Then, n-type impurity ions are implanted, using the resist mask as a mask, and a heat treatment is performed to activate the n-type impurities, thereby forming $n^+$ regions, such as the $n^+$ emitter regions 12 and 22-3, the $n^+$ source regions 22-1 and 22-2, and the $n^+$ drain regions 23-1 and 23-2. Then, an interlayer insulating film, such as a silicon oxide film ($SiO_2$ film) made of BPSG, is formed on the entire front surface of the substrate (Step S9).

Then, the interlayer insulating film is selectively removed to form contact holes through which a portion that comes into contact with an emitter ring 50 (see FIG. 7), the channel regions, the $n^+$ regions, and a guard ring 31 (see FIG. 8-1) in the first and second $p^+$ regions 4-1 and 4-2 are exposed. Then, for example, an aluminum silicon (Al—Si) film is deposited on the entire front surface of the substrate. Then, the aluminum silicon film is patterned to form electrodes on the front surface side of the substrate, such as the emitter electrode 14 of the IGBT in the IGBT portion 10, the emitter electrode 25-3 of the sense IGBT 20c in the circuit portion 20, the source electrodes 25-1 and 25-2 or the drain electrodes 26-1 and 26-2 of the MOSFETs 20a and 20b in the circuit portion 20, aluminum electrodes 51 and 62 forming the emitter ring 50 and a gate runner 60, a field plate 33, and a stopper electrode 34 (Step S10).

Then, a passivation film (protective film) is formed on the entire front surface of the substrate (Step S11). Then, the rear surface of the epitaxial substrate ($p^+$ semiconductor substrate 1) is ground to the thickness of a product which is used as semiconductor device (Step S12). Then, the collector electrode 15 is formed on the entire ground rear surface of the epitaxial substrate ($p^+$ semiconductor substrate 1) (Step S13). In this way, the semiconductor device illustrated in FIGS. 1 to 3-1 is completed.

As described above, according to Embodiment 1, the dielectric separation layer is formed at the boundary between the IGBT portion and the circuit portion so as to pass through the $p^+$ region. Therefore, the effect of suppressing a parasitic current and improving surge resistance to such a degree that a product standard is satisfied is obtained and it is possible to prevent the circuit portion from being broken. As a result, it is possible to protect the circuit portion from a parasitic current or a surge voltage and to reduce costs, as compared to Patent Document 1 in which the dielectric separator layer is formed so as to reach the vicinity of the $p^+$ collector region in the rear surface of the substrate. In addition, according to Embodiment 1, since the IGBT portion and the circuit portion are electrically separated from each other by the dielectric separation region, it is possible to reduce the size of the invalid region in which no element is arranged, as compared to the case in which the IGBT portion and the circuit portion are electrically separated from each other by the self-separation region. Therefore, even when an increase in costs occurs due to an element miniaturization process, it is possible to reduce the size of the chip to such a degree that costs per unit chip area can be reduced.

Embodiment 2

Figures 1, 5:
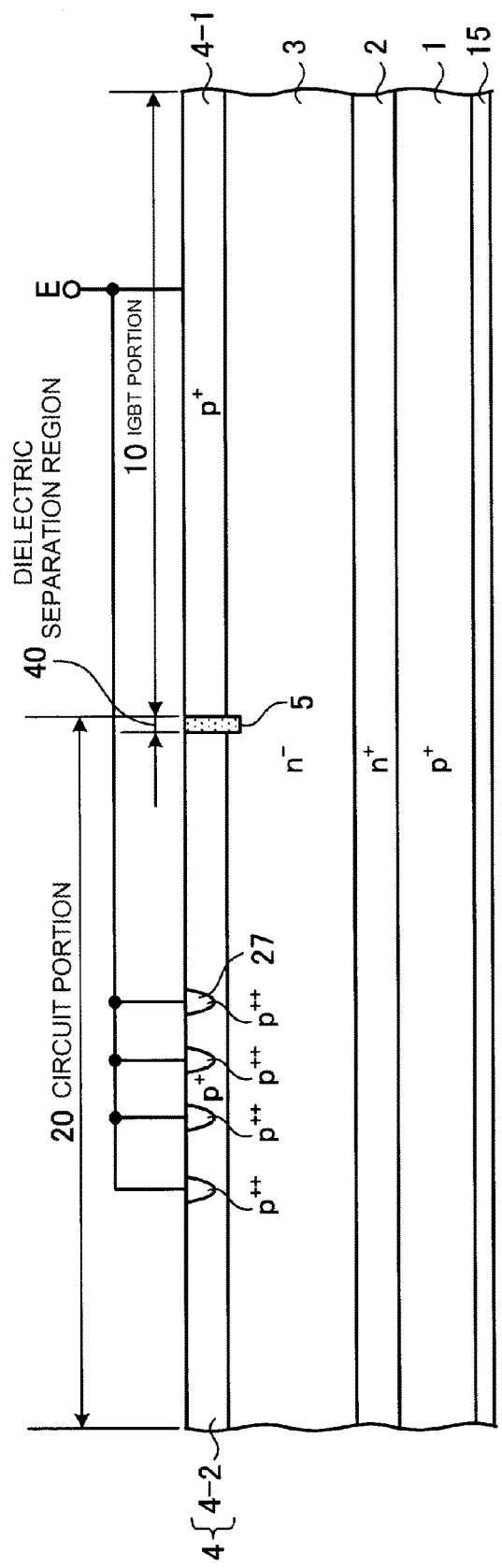
Figures 2, 5:
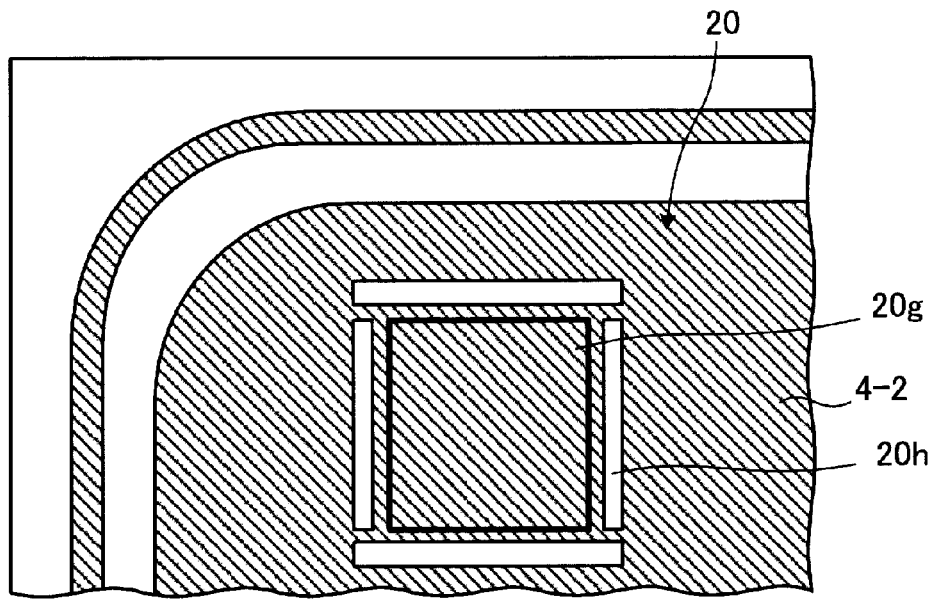
Figures 3, 5:
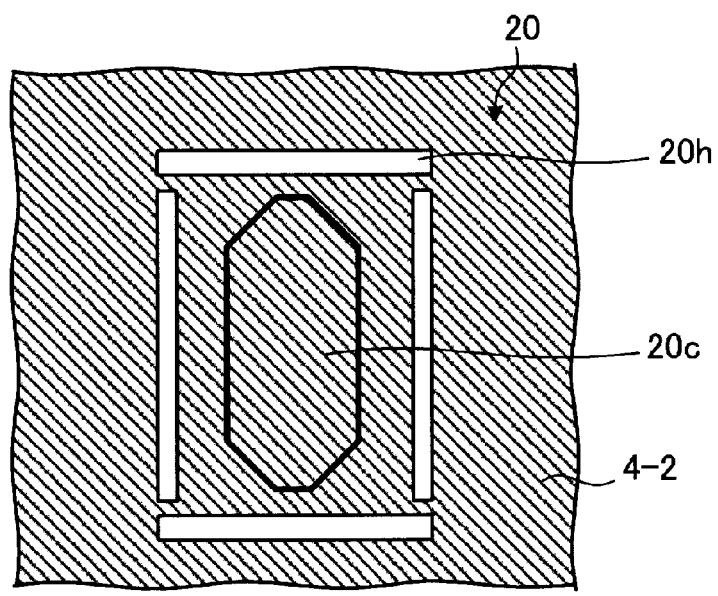
Figure 6:
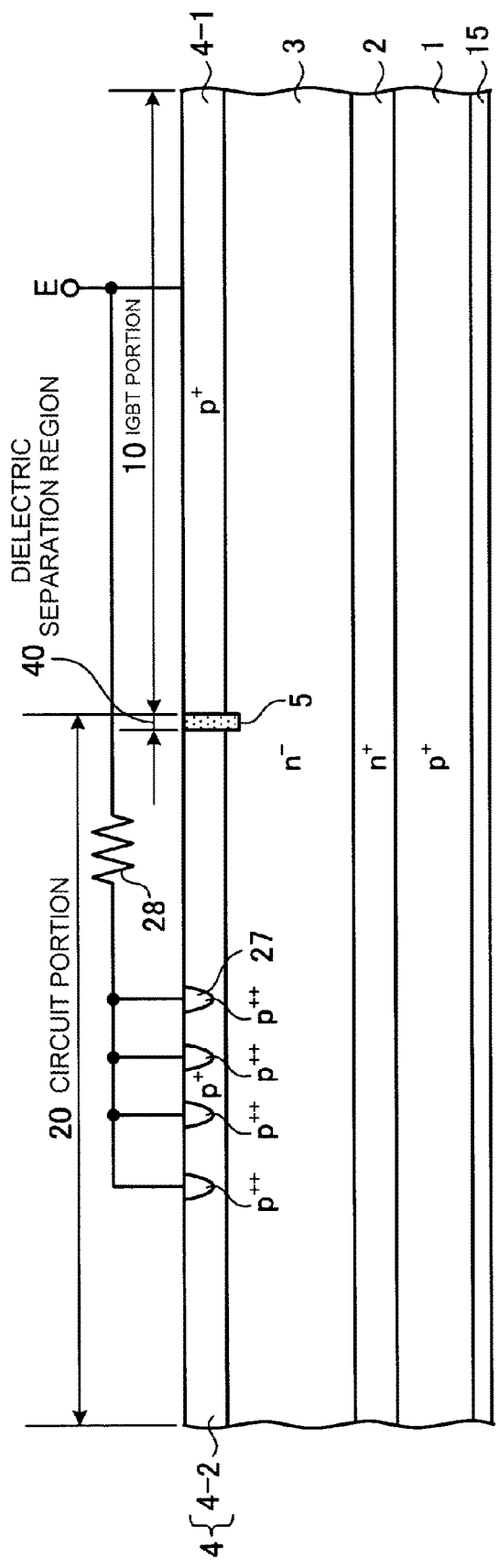
FIG. 6 is a cross-sectional view illustrating the structure of another example of the semiconductor device according to Embodiment 2.

Next, a semiconductor device according to Embodiment 2 will be described. FIG. 5-1 is a cross-sectional view illustrating the structure of the semiconductor device according to Embodiment 2. FIG. 5-2 is a plan view illustrating the planar layout of an individual circuit provided in the circuit portion illustrated in FIG. 5-1 and the periphery thereof. FIG. 5-3 is a plan view illustrating the planar layout of a sense IGBT provided in the circuit portion illustrated in FIG. 5-1 and the periphery thereof. FIG. 6 is a cross-sectional view illustrating the structure of another example of the semiconductor device according to Embodiment 2. The planar layout of the semiconductor device according to Embodiment 2 is the same as that illustrated in FIG. 1. The semiconductor device according to Embodiment 2 differs from the semiconductor device according to Embodiment 1 in that an emitter contact electrode with an emitter potential (ground potential) is selectively provided in a circuit portion 20 to discharge a parasitic current which flows from an IGBT portion 10 to a second $p^+$ region 4-2 in the circuit portion 20 to an emitter electrode of an IGBT in the IGBT portion 10 through an emitter contact electrode (first contact electrode) (hole drawing).

Specifically, as illustrated in FIGS. 5-1 and 6, a $p^{++}$ contact region 27 is selectively provided in the second $p^+$ region 4-2. The $p^{++}$ contact region 27 is connected to an emitter contact electrode (not illustrated) which is made of, for example, aluminum (Al) through a contact hole 20h formed in an interlayer insulating film (not illustrated) which is provided on the front surface side of a chip. For example, the emitter contact electrode is connected to the emitter electrode (not illustrated) of the IGBT in the IGBT portion 10 through a wiring line which is provided on the front surface of the chip. That is, the second $p^+$ region 4-2 is electrically connected to the emitter electrode of the IGBT in the IGBT portion 10.

The second $p^+$ region 4-2 is formed in most (for example, 80% or more of the area of the circuit portion 20) of a surface layer of the front surface of the chip in the circuit portion 20. When the first $p^+$ region 4-1 and the second $p^+$ region 4-2 selectively come into contact with each other, the second $p^+$ region 4-2 and the emitter electrode of the IGBT in the IGBT portion 10 may be connected to each other through the first $p^+$ region 4-1. In addition, as illustrated in FIG. 5-2, it is preferable that the second $p^+$ region 4-2 be provided so as to surround an individual circuit 20g which is provided in the circuit portion 20 (to surround three or more sides of each element having a substantially rectangular shape in a plan view; four sides of each element in the example illustrated in FIG. 5-2) and the contact hole 20h be provided along each side of the individual circuit 20g. Each element forming the individual circuit 20g may be surrounded by the second p+ region 4-2. Similarly, as illustrated in FIG. 5-3, it is preferable that the second p+ region 4-2 be provided so as to surround a sense IGBT 20c (to surround three or more sides of each element having a substantially rectangular shape in a plan view; four sides of each element in the example illustrated in FIG. 5-3) and the contact hole 20h be provided along each side of the sense IGBT 20c. The reason is that, as a contact area with the second p+ region 4-2 increases, the influence of the parasitic current of the IGBT in the IGBT portion 10 is reduced. In addition, the emitter contact electrode may be provided in the vicinity of each element in the circuit portion 20. The reason is that, as the distance between the element and the emitter contact electrode increases, the potential of the second p+ region 4-2 increases due to the current which flows during hole drawing and the element is more likely to be broken.

As illustrated in FIG. 6, a ground resistance 28 may be provided between the second p+ region 4-2 and the emitter contact electrode. As such, when the ground resistor 28 is provided, it is possible to further improve the effect of hole drawing.

As described above, according to Embodiment 2, it is possible to obtain the same effect as that in Embodiment 1. In addition, according to Embodiment 2, a parasitic current or a surge current which flows in the circuit portion flows to the emitter contact electrode. Therefore, it is possible to prevent the latch-up of each element in the circuit portion and to improve the protection performance of the circuit portion.

Embodiment 3

Figure 7:
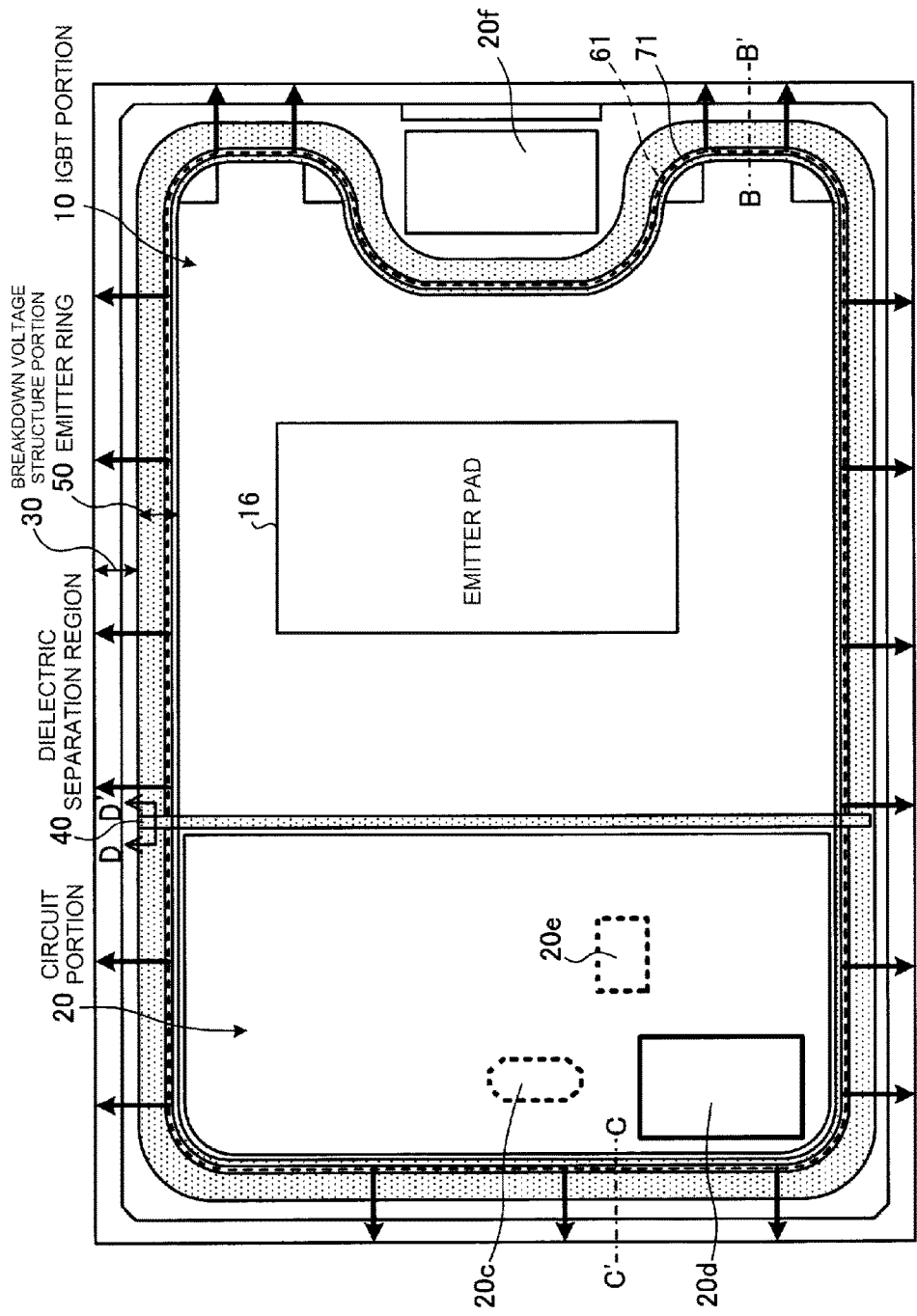
FIG. 7 is a plan view illustrating the planar layout of a semiconductor device according to Embodiment 3.
Figures 1, 8:
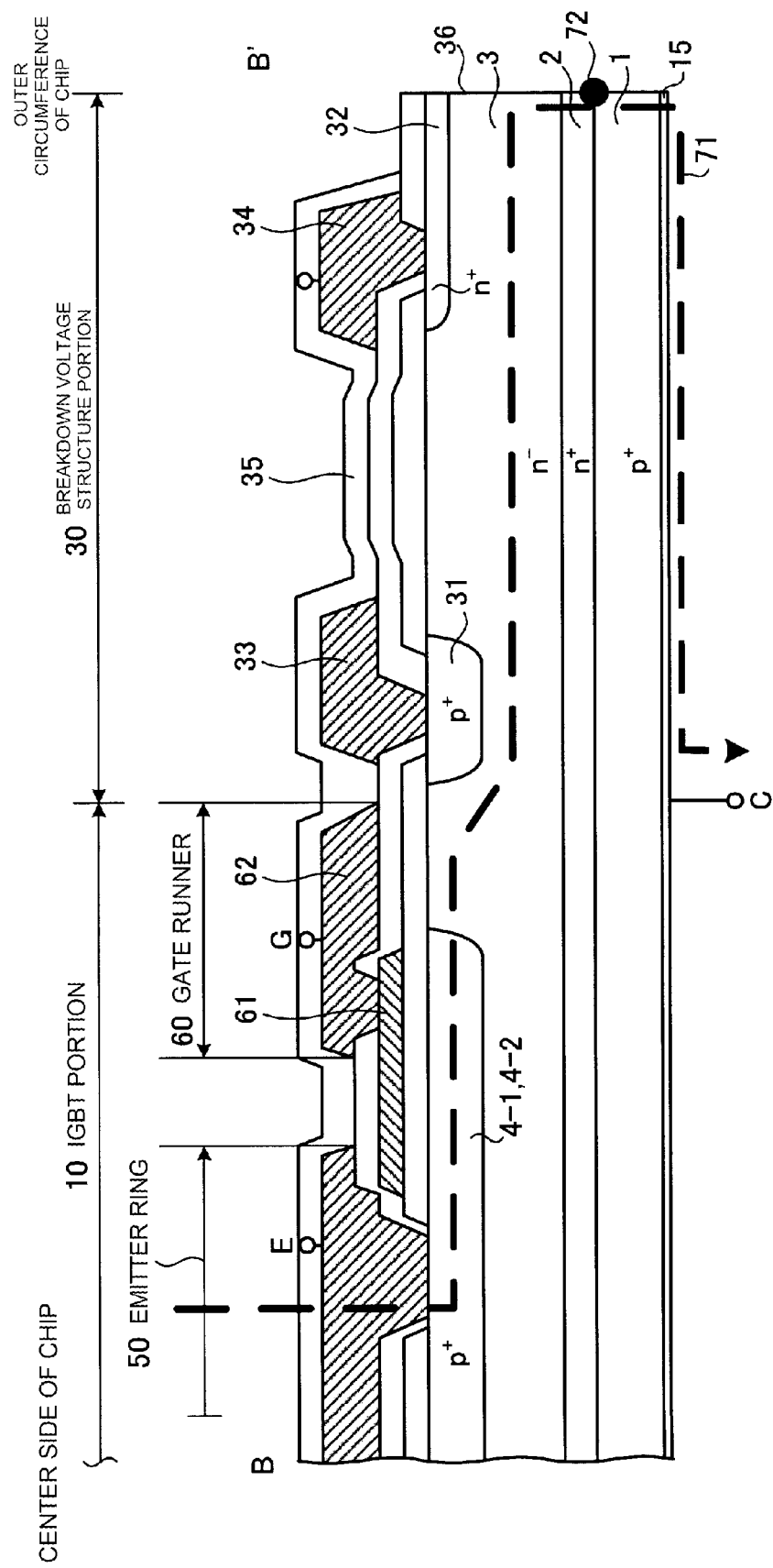
Figures 2, 8:
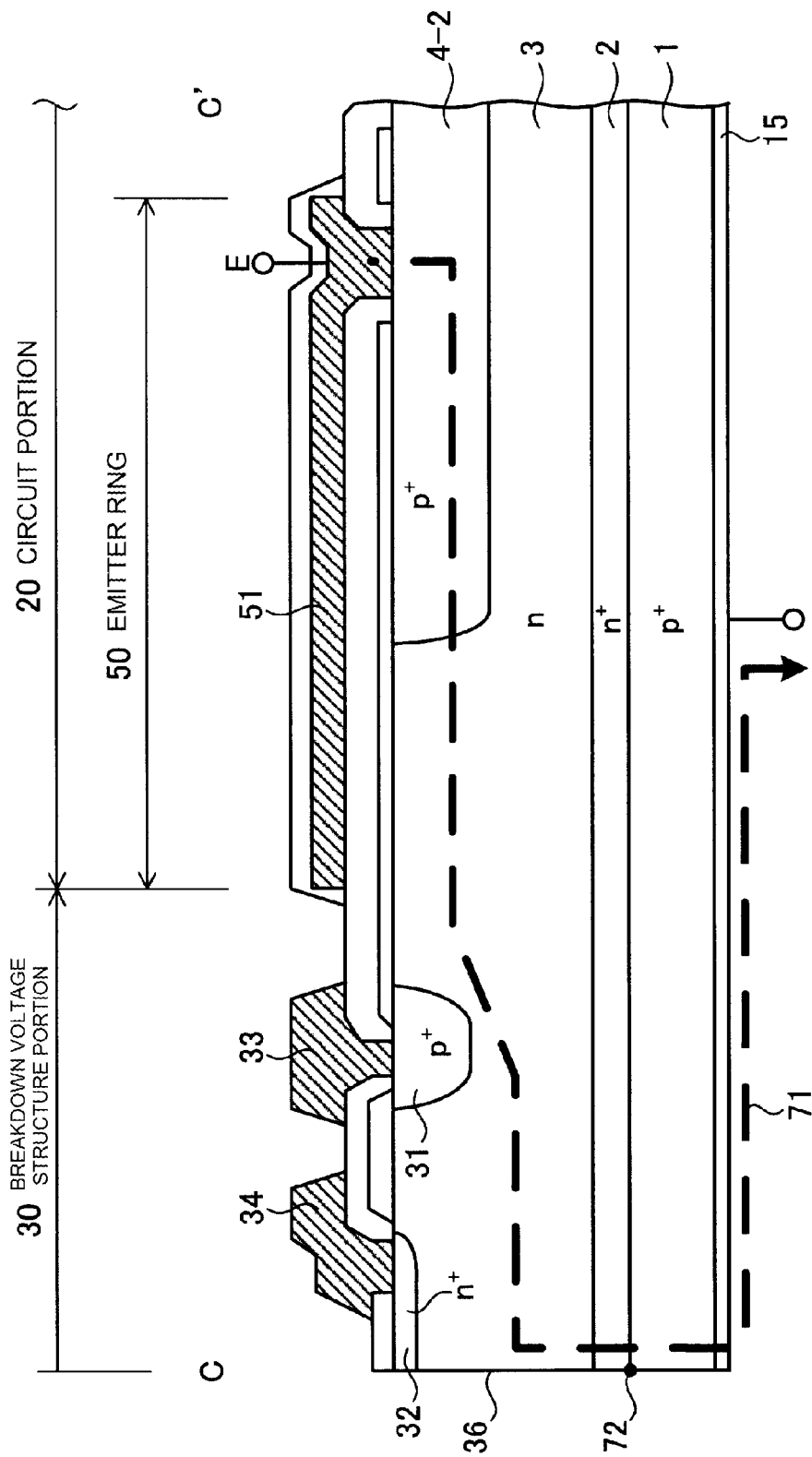
Figures 3, 8:
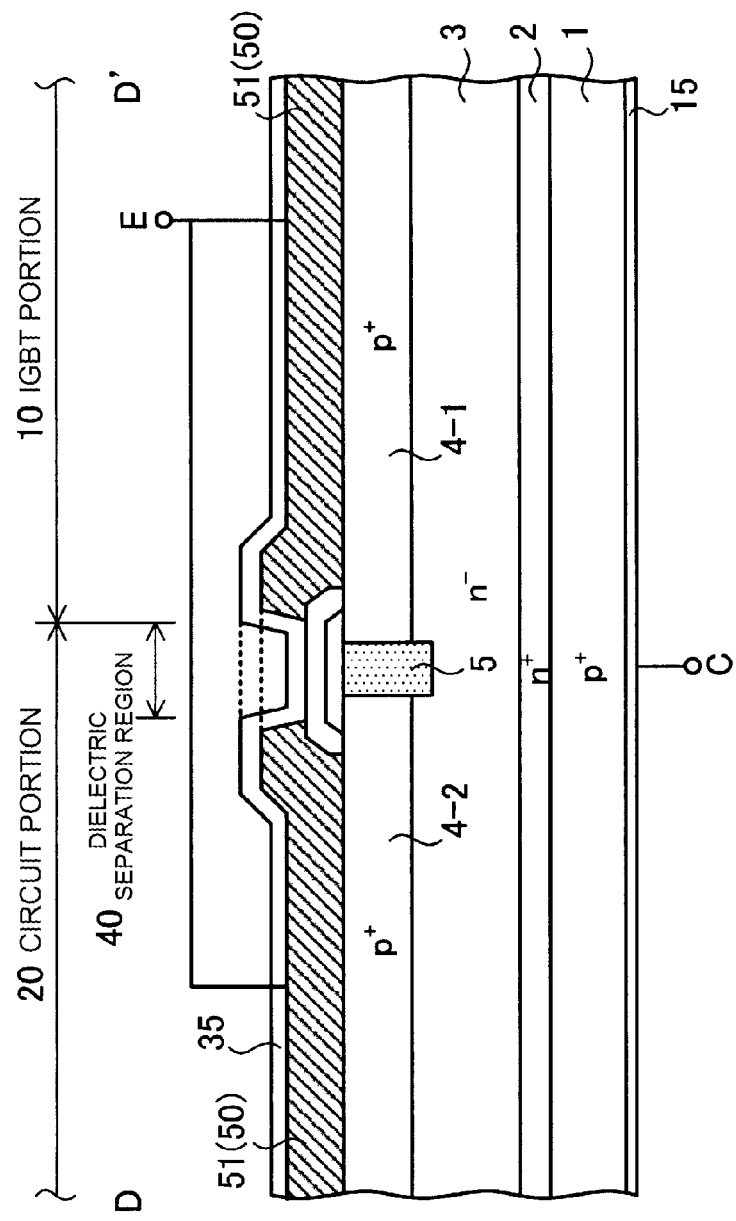
Figures 4, 8:
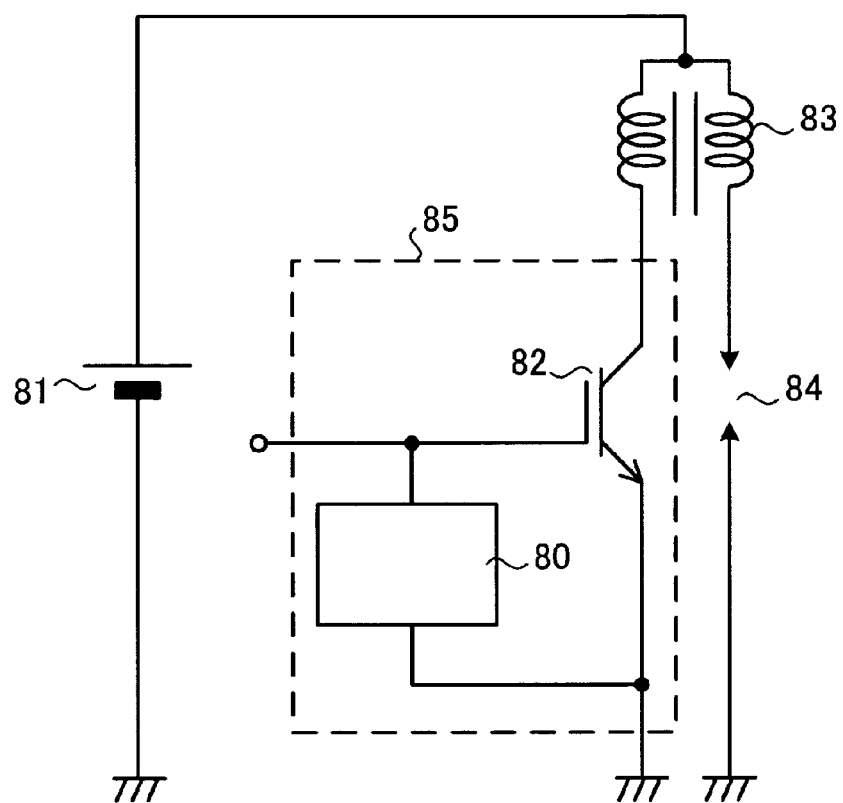
Figures 5, 8:
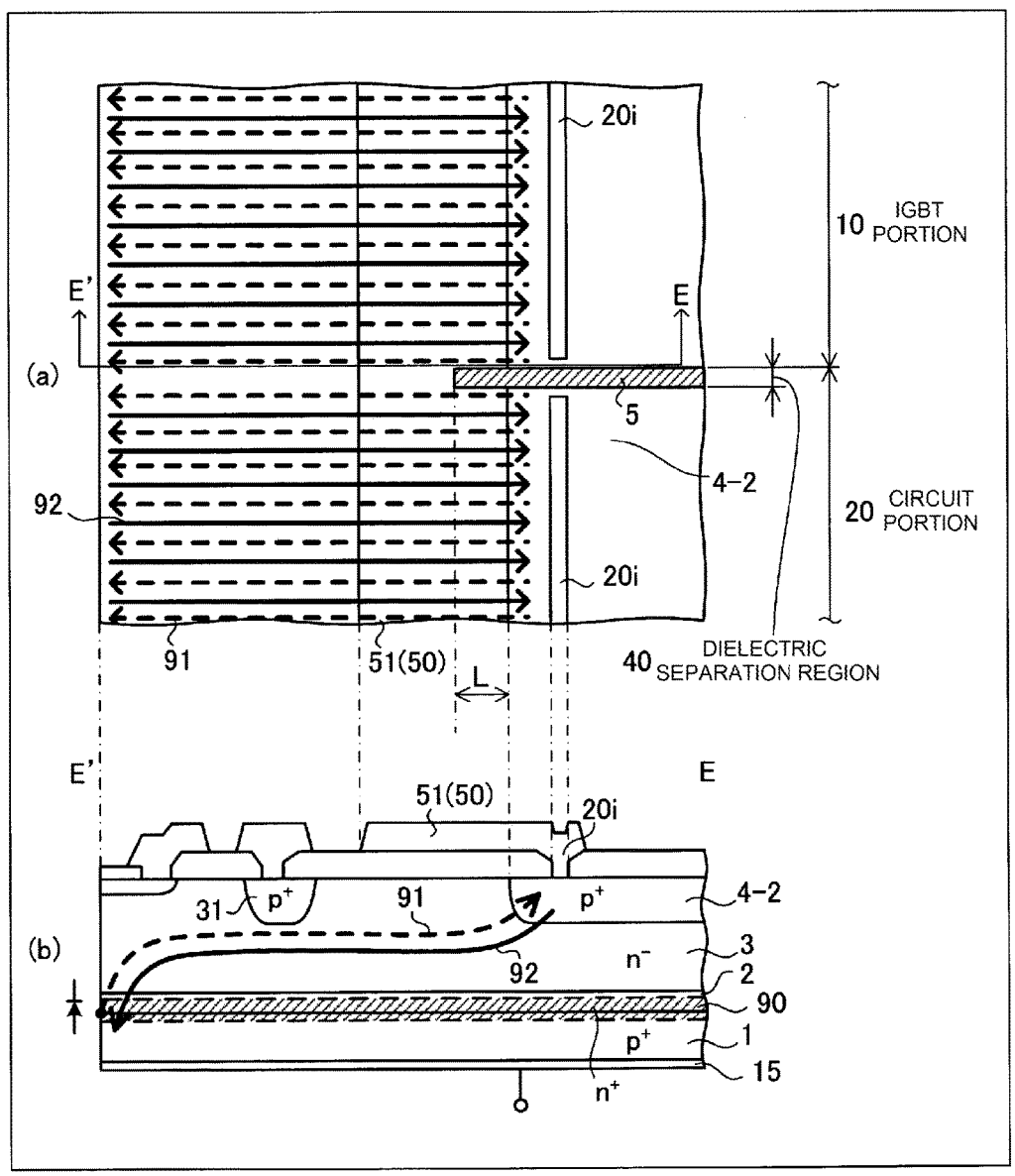
Figures 6, 8:
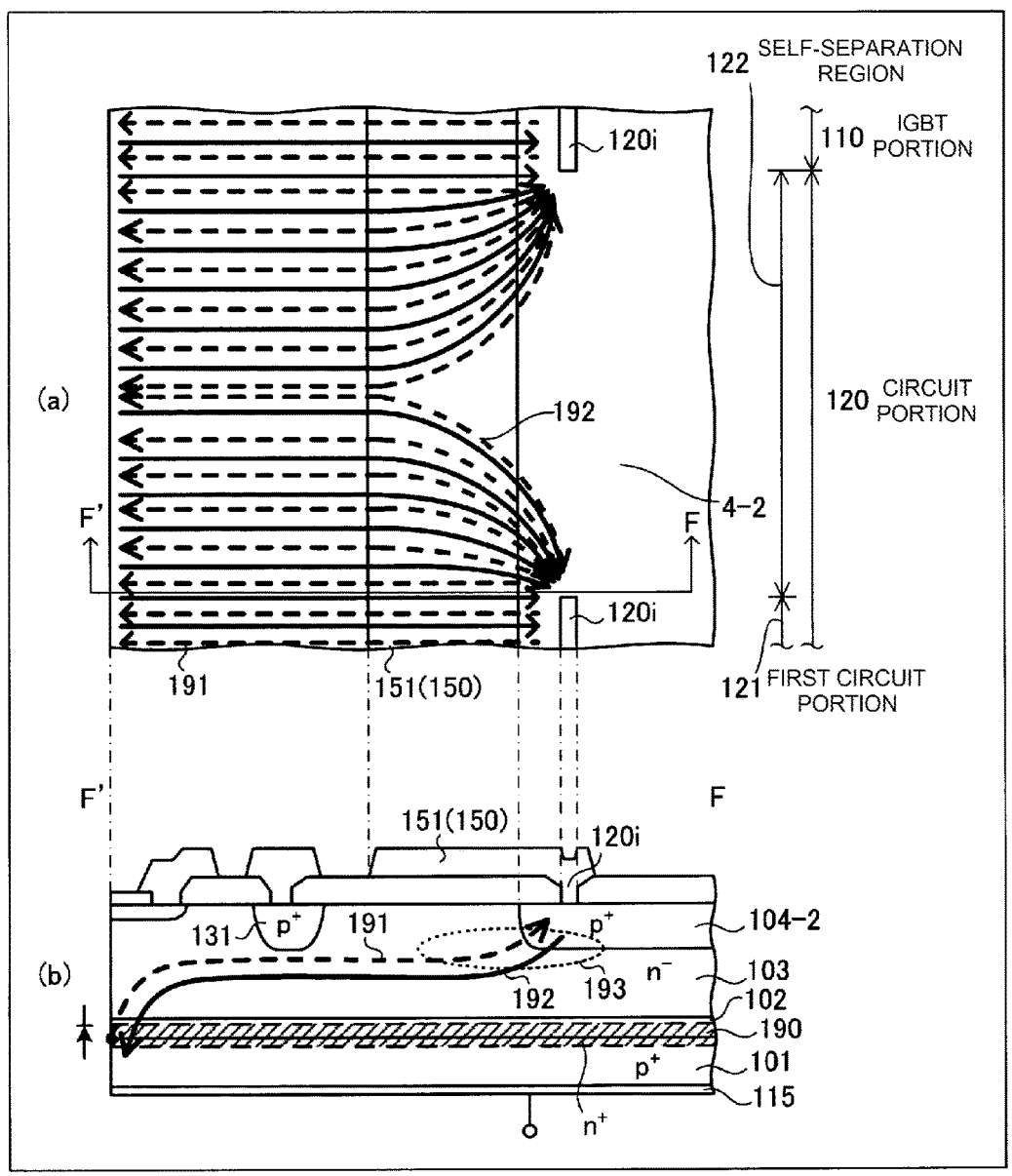

Next, a semiconductor device according to Embodiment 3 will be described. FIG. 7 is a plan view illustrating the planar layout of the semiconductor device according to Embodiment 3. FIG. 8-1 is a cross-sectional view schematically illustrating a cross-sectional structure taken along the cutting line B-B' of FIG. 7. FIG. 8-2 is a cross-sectional view schematically illustrating a cross-sectional structure taken along the cutting line C-C' of FIG. 7. FIG. 8-3 is a cross-sectional view schematically illustrating a cross-sectional structure taken along the cutting line D-D' of FIG. 7. The arrangement of an IGBT portion 10, a circuit portion 20, a breakdown voltage structure portion 30, and a dielectric separation region 40 in FIG. 7 is the same as that in FIG. 1. The semiconductor device according to Embodiment 3 differs from the semiconductor device according to Embodiment 1 in that an emitter ring 50 is provided in the vicinity of the boundary between the IGBT portion 10 and the breakdown voltage structure portion 30 and the boundary between the circuit portion 20 and the breakdown voltage structure portion 30 so as to surround the IGBT portion 10 and the circuit portion 20.

Specifically, as illustrated in FIGS. 7 and 8-1, a first p+ region 4-1 is provided in a surface layer of the front surface of the chip in the vicinity of the boundary between the IGBT portion 10 and the breakdown voltage structure portion 30 so as to extend from the center of the chip. That is, the first p+ region 4-1 extends from the end of an active cell (an aggregate region in which a plurality of unit cells for turning on or off a main are adjacent to each other) to the vicinity of the breakdown voltage structure portion 30. In the IGBT portion 10, a low-resistance aluminum electrode 51 forming an emitter electrode 14 is provided substantially on the entire front surface of the chip. The aluminum electrode 51 extends from the active cell to the vicinity of the boundary between the IGBT portion 10 and the breakdown voltage structure portion 30. A ring-shaped contact hole 20i (see FIG. 8-5) which brings an extension portion of the first p+ region 4-1 into contact with the end of the aluminum electrode 51 is formed in an interlayer insulating film that is provided between the aluminum electrode 51 and the chip front surface. In particular, the aluminum electrode 51 arranged in the vicinity of the ring-shaped contact hole 20i is referred to as an emitter ring (second contact electrode) 50.

As illustrated in FIGS. 7 and 8-2, a second p+ region 4-2 is provided in a surface layer of the front surface of the chip in the vicinity of the boundary between the circuit portion 20 and the breakdown voltage structure portion 30 so as to extend from the center of the chip. In the circuit portion 20, the aluminum electrode 51 forms the emitter ring (second contact electrode) 50 and is provided in the vicinity of the boundary between the circuit portion 20 and the breakdown voltage structure portion 30 in a substantially U-shape in a plan view. That is, the aluminum electrode 51 is provided along three sides of the circuit portion 20 with a rectangular shape in a plan view, which face the breakdown voltage structure portion 30. Therefore, the emitter ring 50 is arranged in a ring shape so as to surround the circuit portion 20 and the IGBT portion 10 (a hatched portion in FIG. 7). The aluminum electrode 51 comes into contact with the vicinity of the end of the second p+ region 4-2 which is close to the breakdown voltage structure portion 30 through the contact hole 20i provided in the interlayer insulating film. As described in Embodiment 2, the second p+ region 4-2 is formed in most of the circuit portion 20 and extends from the circuit portion 20 so as to reach the breakdown voltage structure portion 30. Therefore, it is possible to bring the aluminum electrode 51 into contact with the second p+ region 4-2 through the contact hole 20i in a ring shape.

In the IGBT portion 10 and the circuit portion 20, it is preferable to bring the entire chip-side surface of the aluminum electrode 51 forming the emitter ring 50 into contact with the first and second p+ regions 4-1 and 4-2 through the contact hole 20i. The end of the aluminum electrode 51 which is close to the center of the chip and the end of the aluminum electrode 51 which is close to the breakdown voltage structure portion 30 each extend on the interlayer insulating film. The aluminum electrode 51 is electrically connected to, for example, an emitter pad 16 and has the emitter potential of the IGBT in the IGBT portion 10.

A plurality of individual circuits (for example, a protective circuit and a detection path) are provided in the circuit portion 20 and are connected to each other in a predetermined pattern. For example, as described in Embodiment 1, a sense IGBT 20c is provided in the circuit portion 20. A gate pad 20d is provided in the circuit portion 20 such that the area of the IGBT portion 10 is reduced. In addition, a gate-emitter zener diode 20e for protection between the gate and emitter of the IGBT in the IGBT portion 10 is provided in the circuit portion 20. A collector-gate zener diode 20f for protection between the collector and the gate is provided on the breakdown voltage structure portion 30 between the IGBT portion 10 and a stopper electrode 34 which is connected to a channel stopper region 32 provided at the end of the chip. Therefore, the emitter ring 50 has a planar shape in which a portion facing the collector-gate zener diode 20f is bent inward so as to avoid the collector-gate zener diode 20f. In addition, circuits (not illustrated) with many functions are provided. However, the individual circuits will not be described.

In the outermost circumference of the IGBT portion 10 and the circuit portion 20, between the emitter ring 50 and the breakdown voltage structure portion 30, a gate line 61 made of polysilicon is provided over the front surface of the chip, with an oxide film interposed therebetween, and an aluminum electrode 62 is provided so as to come into contact with the gate line 61. The aluminum electrode 62 is arranged along the emitter ring 50 in the IGBT portion 10. A gate runner 60 is formed by the aluminum electrode 62 with a gate potential. A breakdown voltage structure including a $p^+$ guard ring 31, an $n^+$ channel stopper region 32, a field plate 33, and a stopper electrode 34 is provided in the breakdown voltage structure portion 30. Reference numeral 35 is a passivation film which is, for example, a silicon nitride film ($Si_3N_4$ film).

For example, the dielectric separation region 40 is linearly formed so as to traverse the emitter ring 50 from the center to the outside of the chip. The cross-sectional structure of the dielectric separation region 40 immediately below the emitter ring 50 (the cross-sectional structure taken along the cutting line D-D' of FIG. 7) will be described with reference to FIG. 8-3. As illustrated in FIG. 8-3, a dielectric separation layer 5 is flat on the front surface of the chip. When the depth d11 of the dielectric separation layer 5 is greater than that of the first and second $p^+$ regions 4-1 and 4-2, the first and second $p^+$ regions 4-1 and 4-2 are divided by the dielectric separation layer 5. The emitter ring 50 formed on the front surface of the chip is connected to the first and second $p^+$ regions 4-1 and 4-2. That is, even when the first and second $p^+$ regions 4-1 and 4-2 are divided by the dielectric separation layer 5, the aluminum electrode 51 forming the emitter ring 50 causes the first and second $p^+$ regions 4-1 and 4-2 to have an emitter potential. In FIG. 8-3, the aluminum electrode 51 in the IGBT portion 10 is separated from the aluminum electrode 51 in the circuit portion 20. However, the aluminum electrode 51 in the IGBT portion 10 and the aluminum electrode 51 in the circuit portion 20 may be connected to each other above the dielectric separation layer 5.

Next, the effect of the emitter ring 50 when the IGBT in the IGBT portion 10 is used as, for example, a switch of an igniter will be described with reference to FIGS. 7, 8-1, 8-2, and 8-4. FIG. 8-4 is a circuit diagram illustrating the circuit structure of a general internal-combustion engine ignition device. In the internal-combustion engine ignition device, a high-potential-side terminal of a power supply 81 is connected to an ignition coil 83. A high-potential-side terminal of a one-chip igniter 85 is connected to a primary coil of the ignition coil 83. A low-potential-side terminal of the one-chip igniter 85 is earthed to, for example, a frame (metal case) with a ground potential. A spark plug 84 is connected to a secondary coil of the ignition coil 83. The turn ratio of the ignition coil 83 is set such that a secondary voltage is, for example, 100 times higher than a primary voltage. The one-chip igniter 85 is a semiconductor device that controls the flow of a low-voltage current to the primary coil of the ignition coil 83.

In the one-chip igniter 85, an IGBT 82 forming a switch which controls the flow of a low-voltage current to the primary coil of the ignition coil 83 and a gate driving circuit for controlling the IGBT 82 are arranged on the same chip. The IGBT 82 is arranged in the IGBT portion 10. The gate driving circuit or a protective circuit 80 and the gate-emitter zener diode 20e are arranged in the circuit portion 20. A high-potential-side terminal of the protective circuit 80 is connected between a gate terminal of the IGBT 82, and an output terminal of the gate driving circuit (not illustrated). A low-potential-side terminal of the protective circuit 80 is connected to the emitter electrode 14 of the IGBT 82. The collector-gate zener diode 20f is arranged so as to connect the collector electrode 15 and the gate electrode of the IGBT 82.

When the IGBT 82 in the IGBT portion 10 is turned on, a current flows from the rear surface (a surface close to the collector electrode 15) to the front surface (a surface close to the emitter electrode) of the chip through a portion with the lowest resistance. On the other hand, the inventors found that, in a case in which the IGBT 82 in the IGBT portion 10 was turned off, when a voltage generated by the secondary coil of the ignition coil 83 was not discharged or when the voltage generated by the secondary coil was discharged to the ground, a current flowed from the emitter to the collector of the IGBT 82 in the IGBT portion 10 (the current flowed in the reverse direction). As such, when a current (hereinafter, referred to as a reverse current) flows from the emitter to the collector of the IGBT 82, a reverse current 71 which has flowed into the front surface (emitter pad 16) of the chip front flows to the collector electrode 15 through a chip side surface 36. The reason is as follows.

A breakdown voltage of about 30 V to 50 V is ensured by the pn junction between the $p^+$ semiconductor substrate 1 and the $n^+$ buffer region 2. The chip side surface 36 is mechanically cut by dicing and the crystalline state of silicon in the chip side surface 36 is rougher than that at the center of the chip. Therefore, the breakdown voltage of a pn junction end portion 72 of the chip side surface 36 between the $p^+$ semiconductor substrate 1 and the $n^+$ buffer region 2 is lower than that at the center of the chip. When the reverse current 71 flows, the pn junction between the $p^+$ semiconductor substrate 1 and the $n^+$ buffer region 2 is reversely biased. When the reverse bias voltage is higher than the breakdown voltage of the pn junction between the $p^+$ semiconductor substrate 1 and the $n^+$ buffer region 2, avalanche breakdown occurs. The breakdown current can cause the reverse current 71 to flow to the chip. That is, the reverse current 71 which has flowed into the emitter pad 16 flows to the rear surface (a surface close to the collector electrode 15) of the chip through the pn junction end portion 72 between the $p^+$ semiconductor substrate 1 and the $n^+$ buffer region 2 in the chip side surface 36.

In this case, when the emitter ring 50 is not provided, the reverse current 71 flows to a plurality of contact holes 20i (contact holes in the emitter electrode 14 and the second $p^+$ region 4-2) provided in the circuit portion 20. However, since the area of the contact hole 20i in the circuit portion 20 is significantly less than that of the contact hole 20i of the IGBT in the IGBT portion 10, current density increases and a current is concentrated on the contact hole 20i in the circuit portion 20. As a result, the possibility of the chip being broken increases. In contrast, when the emitter ring 50 is provided so as to surround the IGBT portion 10 and the circuit portion 20, the reverse current 71 which has flowed into the emitter pad 16 can uniformly flow to a chip outer circumferential portion of the IGBT portion 10 and the circuit portion 20 through the emitter ring 50. According to this structure, the reverse current 71 which flows to the IGBT in the IGBT portion 10 can be consumed in the entire chip outer circumferential portion. Therefore, it is possible to ensure a negative surge resistance (resistance to the reverse current) which is proportional to the circumferential length of the chip outer circumferential portion. That is, it is possible to effectively use the chip outer circumferential portion in the circuit portion 20 in order to improve the negative surge resistance of the IGBT portion 10. In general, it is not necessary to provide a diode which is connected in parallel to the IGBT in order to prevent a current from flowing to the IGBT in the reverse direction. Therefore, it is possible to prevent an increase in the size of the chip. When the chip size is the same, the circumferential length of the chip outer circumferential portion in a rectangular chip is larger than that in a square chip. Therefore, when the chip is formed in a rectangular shape, it is possible to further improve the negative surge resistance.

Figure 14:
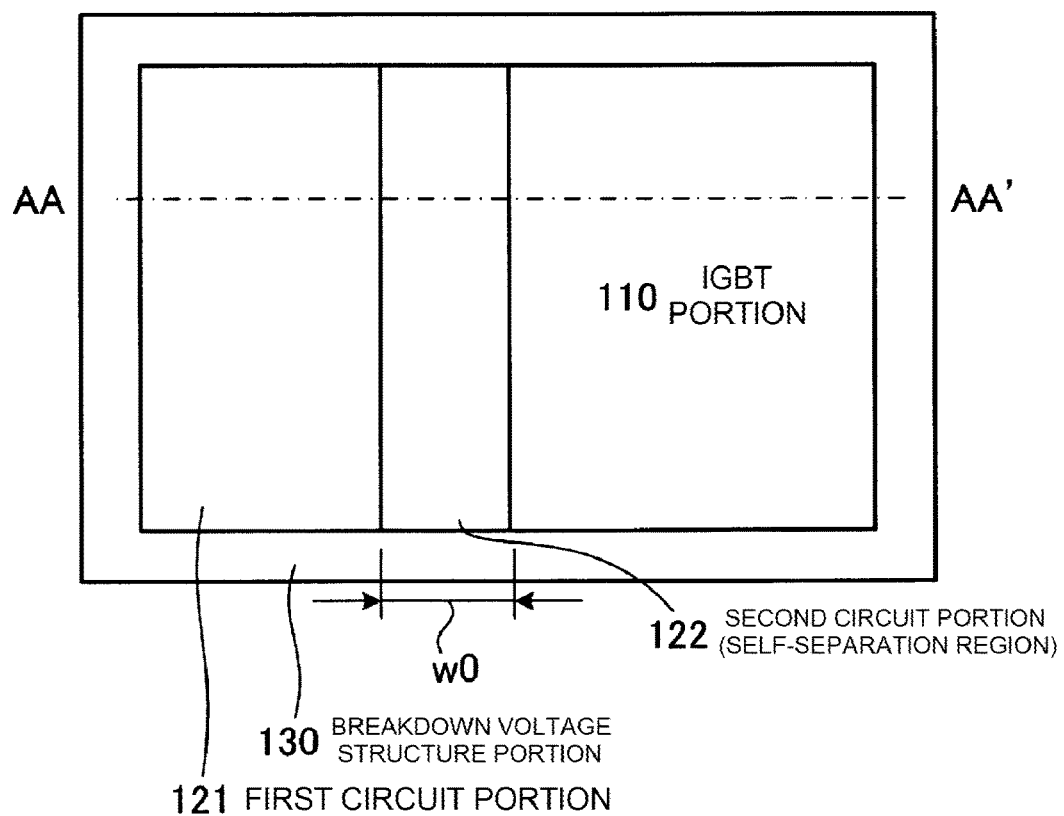
FIG. 14 is a plan view illustrating the planar layout of a one-chip igniter according to the related art.

Next, the improvement of the negative surge resistance by changing the self-separation structure to the dielectric separation structure will be described. FIG. 8-5 is a diagram illustrating the internal operation of the semiconductor device according to Embodiment 3. FIG. 8-6 is a diagram illustrating the internal operation of the semiconductor device according to the related art. FIG. 8-5($a$) is a plan view illustrating the internal operation of the semiconductor device with the dielectric separation structure according to the invention. FIG. 8-5($b$) is a cross-sectional view illustrating the internal operation taken along the cutting line E-E' of FIG. 8-5($a$). FIG. 8-6($a$) is a plan view illustrating the internal operation of the semiconductor device with the self-separation structure according to the related art illustrated in FIGS. 14 and 15. FIG. 8-6($b$) is a cross-sectional view illustrating the internal operation taken along the cutting line F-F' of FIG. 8-6($a$).

As illustrated in FIG. 8-6, in the self-separation structure of the semiconductor device according to the related art, the distance between the IGBT portion 110 and the first circuit portion 121 is sufficiently long and the first circuit portion 121 is separated from the IGBT portion 110 in order to suppress the parasitic current of the IGBT in the IGBT portion 110. According to this structure, it is difficult to form the contact hole 120$i$ for the contact between the emitter line and the silicon substrate in the self-separation region 122. Therefore, an aluminum electrode 151 is connected to an emitter ring 150 provided in the upper part in the self-separation region 122 in order to make a current flow between the IGBT portion 110 and the circuit portion 120. However, a contact hole 120$i$ for a contact with the silicon substrate is not formed in the self-separation region 122 for the above-mentioned reason. The length of a separation region of the contact hole 120$i$ (that is, the width w0 of the self-separation region 122) is, for example, equal to or greater than 800 μm. When the chip has a size of 4 mm×3 mm, the contact hole 120$i$ does not come into contact with the silicon substrate in a region which is about 11% of the total length of the emitter ring 150.

For example, when a negative surge voltage is applied for a short period, a breakdown voltage $V_{EC}$ between the emitter and the collector of the igniter IGBT during the application of a reverse bias is theoretically the breakdown voltage of the pn junction between the p$^+$ semiconductor substrate 101 and the n$^+$ buffer region 102. However, since the outer circumference of the chip is generally damaged during dicing, the breakdown voltage of the pn junction between the p$^+$ semiconductor substrate 101 and the n$^+$ buffer region 102 in the end surface of the chip (the side surface of the chip) is relatively lower than that at the center of the chip which is substantially equal to the theoretical value. For example, when a negative surge is applied to the igniter, avalanche breakdown occurs in the pn junction between the p$^+$ semiconductor substrate 101 and the n$^+$ buffer region 102 exposed from the end of the chip, as illustrated in FIG. 8-6($b$).

Among the carriers generated by the avalanche breakdown, a hole flows to the p$^+$ semiconductor substrate 101 and an electron flows to the n$^-$ drift region 103 through a depletion layer 190 and then flows to the contact hole 120$i$ formed in the emitter ring 150 (the flow of the electron is represented by an arrow indicated by reference numeral 191 in FIG. 8-6). The contact hole 120$i$ comes into contact with a second p$^+$ region 104-2 (a p$^+$ region 104 in the circuit portion 120) and the electron moved to the contact hole 120$i$ is injected into the second p$^+$ region 104-2. In this case, since a forward bias is applied to the pn junction between the second p$^+$ region 104-2 and the n$^-$ drift region 103, the hole is injected from the second p$^+$ region 104-2 to the n$^-$ drift region 103 by the injection of the electron (the flow of the hole is represented by an arrow indicated by reference numeral 192 in FIG. 8-6).

The hole injected into the n$^-$ drift region 103 is moved to the pn junction between the p$^+$ semiconductor substrate 101 and the n$^+$ buffer region 102 at the end of the chip through the n$^-$ drift region 103, while being attracted to the electron by Coulomb's force, as illustrated in FIGS. 8-6($a$) and 8-6($b$). When the hole is moved into the depletion layer 190, the hole is drifted and accelerated and flows to the p$^+$ semiconductor substrate 101. The hole current 192 becomes a collector current of a pnp parasitic transistor formed by the second p$^+$ region 104-2, the n$^-$ drift region 103, and the p$^+$ semiconductor substrate 101. As described above, in the self-separation structure, since the separation distance of the contact hole 120$i$ is equal to or greater than 800 μm, a very large amount of electron current 191 and the hole current 192 which is injected due to the electron current 191 are concentrated on the end (carrier concentration region 193) of the contact hole 120$i$. Then, current density increases and the chip is likely to be broken. This makes it difficult to reduce the chip side of the one-chip igniter.

In contrast, in the dielectric separation structure according to the invention, as illustrated in FIG. 8-5($a$), the width w1 of the dielectric separation region 40 is a minimum of several micrometers and can be about one-hundredth of that in the self-separation structure. Therefore, when it is considered that the thickness of the n$^-$ drift region 3 is in the range of several tens of micrometers to several hundreds of micrometers, excessive current concentration does not occur, unlike the self-separation structure, and the electron current 91 and the hole current 92 can uniformly flow to the emitter ring 50. In FIG. 8-5($b$), reference numeral 90 indicates a depletion layer. According to this structure, it is possible to ensure negative surge resistance which is proportional to the circumferential length of the chip according to the related art.

In addition, there is a case in which a negative surge voltage is repeatedly applied. In general, the contact of the emitter ring 50 is made in the circumference of the chip and a uniform avalanche current flows when the negative surge voltage is applied. Therefore, the temperature of the end surface of the chip increases and the breakdown voltage of the pn junction between the p$^+$ semiconductor substrate 101 and the n$^+$ buffer region 102 increases with the increase in the temperature. In the self-separation structure according to the related art, since the separation distance of the contact hole 120$i$ is equal to or greater than 800 μm, current density is low in the separation region of the contact hole 120$i$. Therefore, the increase in the temperature is reduced and the breakdown voltage of the pn junction between the p$^+$ semiconductor substrate 101 and the n⁺ buffer region 102 does not increase. Therefore, the breakdown voltage is relatively low. As a result, a strong avalanche occurs in the separation region of the contact hole 120i and the chip is likely to be broken. In contrast, in the dielectric separation structure according to the invention, as described above, since the separation distance of the contact hole 20i (that is, the width w1 of the dielectric separation region 40) is about one hundredth of that in the self-separation structure, a current is less likely to be concentrated on the end of the contact hole 20i and it is possible to ensure a sufficiently high negative surge resistance.

As can be seen from the above, in the invention, for example, as illustrated in FIG. 8-5(a), when the end of the dielectric separation layer 5 extends to the outer circumference of the chip over the second p⁺ region 4-2 and the electron is moved into the contact hole 20i, it is possible to physically suppress the injection of the hole due to the movement of the electron. Here, the maximum extension length L of the end of the dielectric separation layer 5 which extends from the outer circumferential end of the second p⁺ region 4-2 to the outer circumference of the chip is, for example, a length to the end of the aluminum electrode 51 forming the emitter ring 50 (hereinafter, referred to as a maximum length). The reason is as follows. In a case in which the extension length L is larger than the maximum length, for example, when the end of the dielectric separation layer 5 protrudes to the outer circumference of the chip so as to reach the guard ring 31, the distribution of the electric field is changed due to a difference in permittivity between a dielectric and silicon, the electric field is concentrated in the vicinity of the end of the dielectric separation layer 5. As a result, there is a concern that the breakdown voltage (of the forward bias) will be reduced. Since the aluminum electrode 51 forming the emitter ring 50 also functions as a field plate, the extension length L may be shorter than the maximum length.

In the above description, in addition to FIG. 8-5 and FIG. 8-6, a situation was assumed in which avalanche breakdown in the end surface of the chip (the side surface of the chip) substantially uniformly occurred in the circumference of the chip. In practice, as described above, it is considered that avalanche occurs at the position where the electric field is most likely to be concentrated since a defect or a rough portion remains in the end surface of the chip due to dicing. The defect or the rough portion in the end surface of the chip can be removed by, for example, the improvement of a chip manufacturing process, but only the removal of the defect of the rough portion is insufficient to uniformize the avalanche breakdown. In addition, in the self-separation structure according to the related art, for example, only a method for changing design dimensions, such as the width of the self-separation region, can be used to reduce current concentration due to the negative surge voltage and it is difficult to avoid the current concentration at the end of the contact. In contrast, in the dielectric separation structure according to the invention, as described above, it is possible to significantly reduce the concentration of a current on the end of the contact. Therefore, it is possible to improve negative surge resistance and further reduce the size of a chip.

One dielectric separation layer 5 is not provided as illustrated in FIG. 8-5(a), but a plurality of dielectric separation layers 5 may be provided in parallel along the boundary between the IGBT portion 10 and the circuit portion 20. However, when the number of dielectric separation layers 5 is too large, the width w1 of the dielectric separation region 40 increases and the above-mentioned effect is less than that in the self-separation structure. Therefore, when a plurality of dielectric separation layers 5 are provided, the number of dielectric separation layers 5 is preferably equal to or greater than about 2 and equal to or less than about 10 or it is preferably equal to or greater than about 2 and equal to or less than about 5.

When the structure of the semiconductor device according to Embodiment 3 is applied to the semiconductor device according to Embodiment 2, the same effect as described above is obtained.

As described above, according to Embodiment 3, it is possible to obtain the same effect as that in Embodiments 1 and 2. In addition, according to Embodiment 3, the provision of the emitter ring makes it possible to improve the protection function of the IGBT portion.

Embodiment 4

Next, a semiconductor device according to Embodiment 4 will be described. FIGS. 9 to 13 are plan views illustrating examples of the planar layout of the semiconductor device according to Embodiment 4. The semiconductor device according to Embodiment 4 differs from the semiconductor device according to Embodiment 1 in the planar layout of dielectric separation regions 41 to 45 including dielectric separation layers 5. The structure of the semiconductor device according to Embodiment 4 is the same as the structure of the semiconductor device according to Embodiment 1 except for the planar layout of the dielectric separation region.

Figure 9:
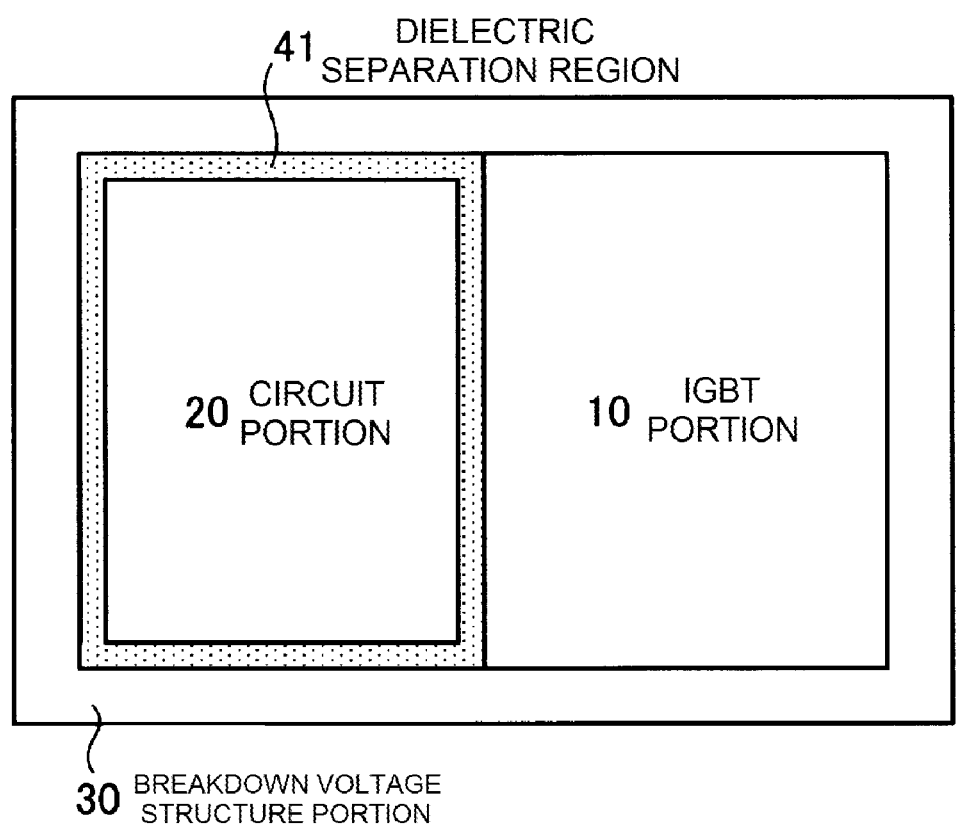
FIG. 9 is a plan view illustrating an example of the planar layout of a semiconductor device according to Embodiment 4.

Each of the dielectric separation regions 41 to 45 may be provided between an IGBT portion 10 and a circuit portion 20 as in at least Embodiment 1. The planar layout can be changed in various ways. For example, as illustrated in FIG. 9, the dielectric separation region 41 may be provided so as to surround the circuit portion 20.

Figure 10:
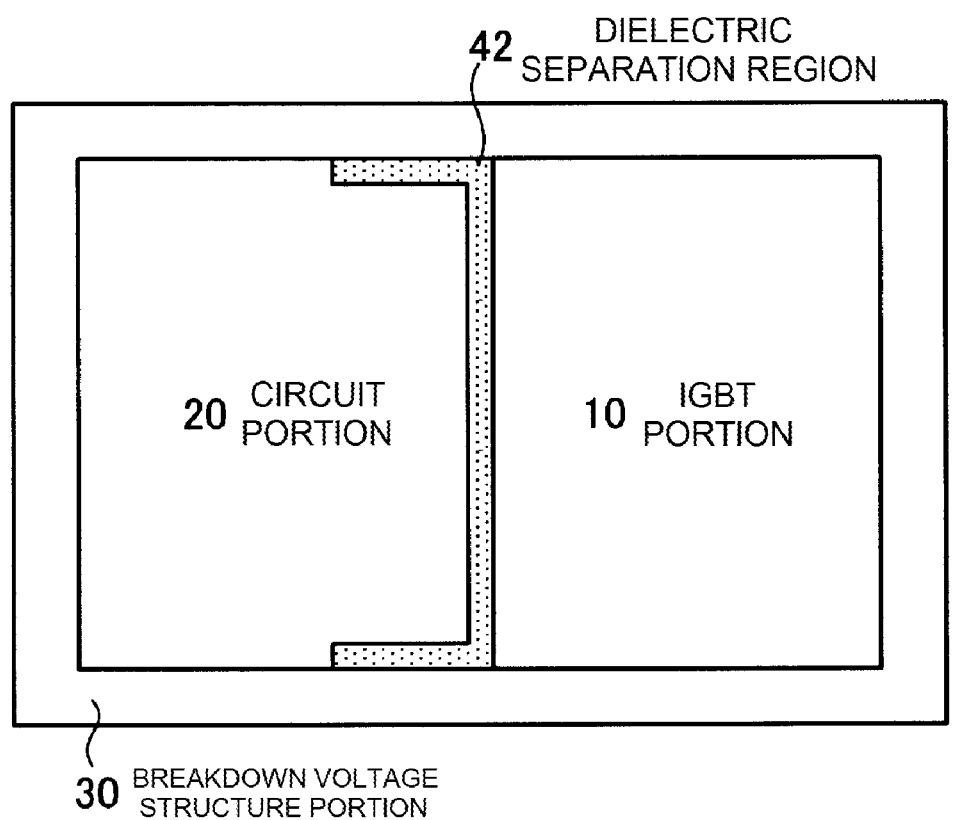
FIG. 10 is a plan view illustrating an example of the planar layout of the semiconductor device according to Embodiment 4.
Figure 11:
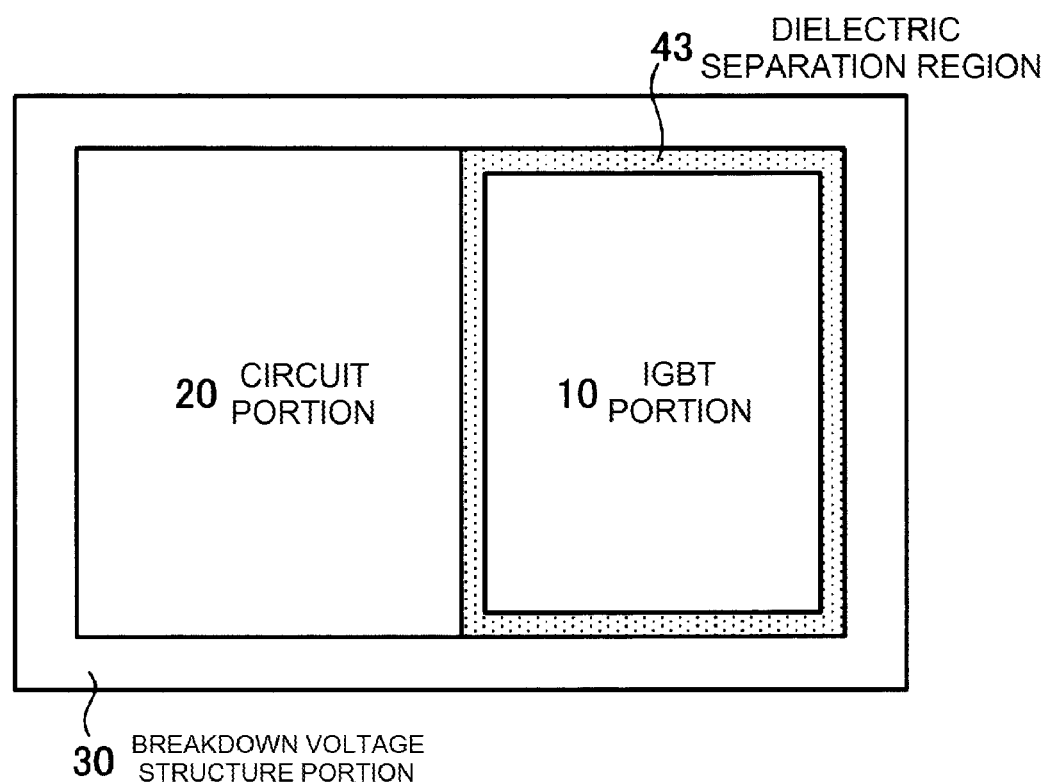
FIG. 11 is a plan view illustrating an example of the planar layout of the semiconductor device according to Embodiment 4.

As illustrated in FIG. 10, the dielectric separation region 42 may provided at the boundary between the IGBT portion 10 and the circuit portion 20 in a planar layout which surrounds a portion of the circuit portion 20 close to the IGBT portion 10 in a U-shape. In this case, for example, the width of the portion of the circuit portion 20 close to the IGBT portion 10, which is surrounded by the dielectric separation region 42, may be 100 μm. This because it is possible to reduce the size of an invalid region in which no element is arranged, as compared to a case in which the width w1 of the dielectric separation region 42 is about 100 μm. In addition, as illustrated in FIG. 11, the dielectric separation region 43 may be provided so as to surround the IGBT portion 10.

Figure 12:
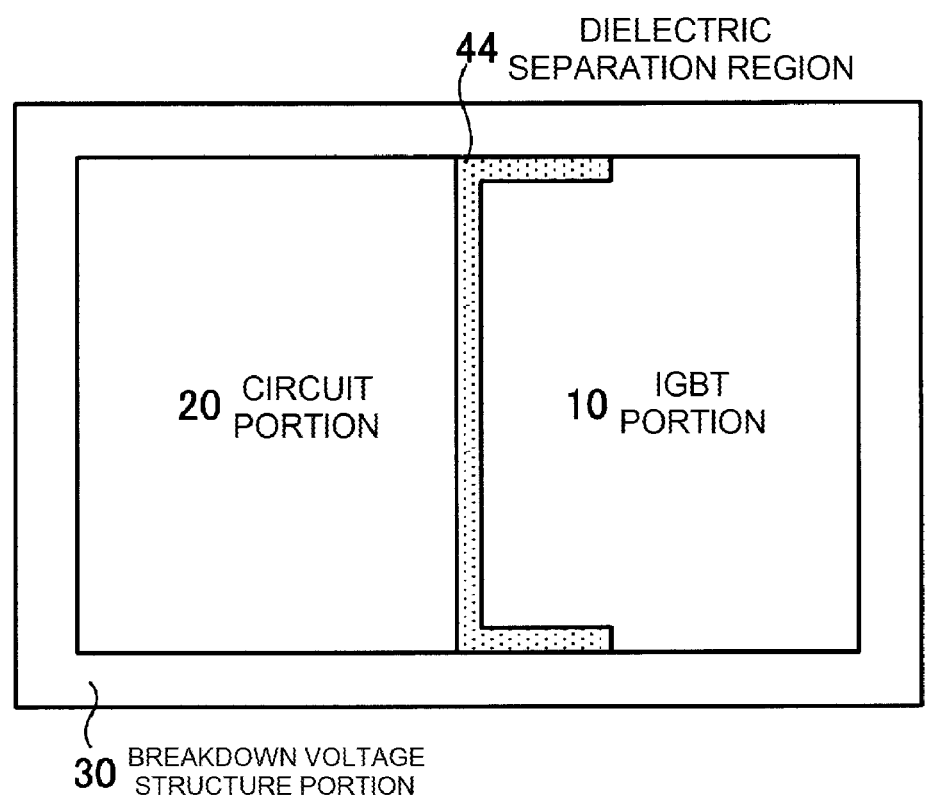
FIG. 12 is a plan view illustrating an example of the planar layout of the semiconductor device according to Embodiment 4.
Figure 13:
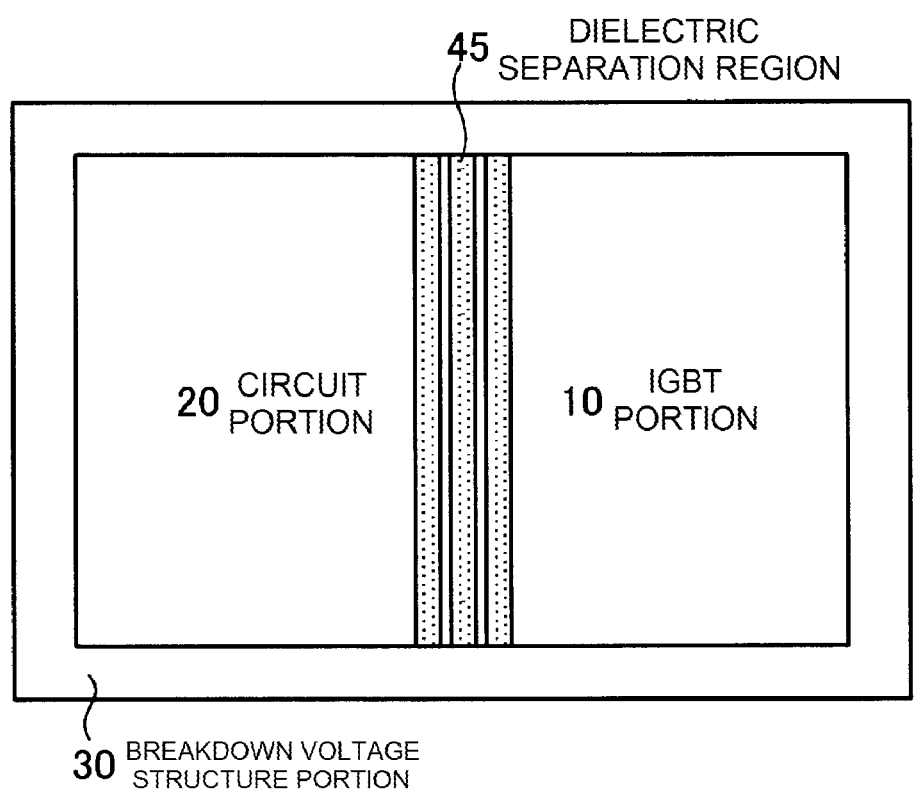
FIG. 13 is a plan view illustrating an example of the planar layout of the semiconductor device according to Embodiment 4.

As illustrated in FIG. 12, the dielectric separation region 44 may provided at the boundary between the IGBT portion 10 and the circuit portion 20 in a planar layout which surrounds a portion of the IGBT portion 10 close to the circuit portion 20 in a U-shape. In this case, for example, the width of the portion of the IGBT portion 10 close to the circuit portion 20, which is surrounded by the dielectric separation region 44, may be 100 μm. The reason is the same as that when the portion of the circuit portion 20 close to the IGBT portion 10 is covered in the U-shape. As illustrated in FIG. 13, a plurality of stripe-shaped dielectric separation regions 45 may be provided so as to linearly extend in a direction parallel to the boundary between the IGBT portion 10 and the circuit portion 20. In this case, the depth of the dielectric separation layer 5 may increase as the plurality of dielectric separation regions 45 become closer to the circuit portion 20.

When the structure of the semiconductor device according to Embodiment 4 is applied to the semiconductor device according to Embodiment 2, the same effect as described above is obtained.

As described above, according to Embodiment 4, it is possible to obtain the same effect as that in Embodiment 1.

In the above-described embodiments of the invention, the igniter is given as an example. However, the invention is not limited to the above-described embodiments and can be applied to circuits with various structures. For example, the invention can be applied to a circuit including a switch (MOSFET) which drives a power window motor. In Embodiments 1 to 3, the example in which the dielectric separation region is provided in a part of the circuit portion which borders the IGBT portion has been described. However, the dielectric separation region may be provided in a part of the IGBT portion which borders the circuit portion. In each of the embodiments, the first conductivity type is a p type and the second conductivity type is an n type. However, in the invention, the first conductivity type may be an n type and the second conductivity type may be a p type. In the case, the same effect as described above is also obtained.

INDUSTRIAL APPLICABILITY

As described above, the semiconductor devices according to the invention are useful for power semiconductor devices in which an IGBT and a circuit portion for controlling the IGBT are provided on the same chip.

EXPLANATIONS OF LETTERS OR NUMERALS

1 $p^+$ SEMICONDUCTOR SUBSTRATE
2 $n^+$ BUFFER REGION
3 $n^-$ DRIFT REGION
4 $p^+$ REGION
4-1 FIRST $p^+$ REGION
4-2 SECOND $p^+$ REGION
5 DIELECTRIC SEPARATION LAYER
5a DIELECTRIC LAYER
5b NON-DOPED POLYSILICON
10 IGBT PORTION
11, 21-1, 21-2 p-TYPE BASE REGION
12, 22-3 $n^+$ EMITTER REGION
13, 24-1, 24-2, 24-3 GATE ELECTRODE
14, 25-3 EMITTER ELECTRODE
15 COLLECTOR ELECTRODE
16 EMITTER PAD
20 CIRCUIT PORTION
20a, 20b MOSFET
20c SENSE IGBT
20d GATE PAD
20e GATE-EMITTER ZENER DIODE
20f COLLECTOR-GATE ZENER DIODE
20g INDIVIDUAL CIRCUIT
20h, 20i, 120i CONTACT HOLE
22-1, 22-2 $n^+$ SOURCE REGION
23-1, 23-2 $n^+$ DRAIN REGION
25-1, 25-2 SOURCE ELECTRODE
26-1, 26-2 DRAIN ELECTRODE
27 p' CONTACT REGION
28 GROUND RESISTANCE
30 BREAKDOWN VOLTAGE STRUCTURE PORTION
31 GUARD RING
32 CHANNEL STOPPER REGION
33 FIELD PLATE
34 STOPPER ELECTRODE
36 CHIP SIDE SURFACE
40 DIELECTRIC SEPARATION REGION
50 EMITTER RING
51, 62 ALUMINUM ELECTRODE
60 GATE RUNNER
61 GATE LINE
71 CURRENT (REVERSE CURRENT) WHICH FLOWS FROM EMITTER TO COLLECTOR OF IGBT IN IGBT PORTION
72 END OF PN JUNCTION BETWEEN $p^+$ SEMICONDUCTOR SUBSTRATE AND $n^+$ BUFFER REGION
80 PROTECTIVE CIRCUIT
81 POWER SUPPLY
82 IGBT
83 IGNITION COIL
84 SPARK PLUG
85 ONE-CHIP IGNITER
90, 190 DEPLETION LAYER
91, 191 FLOW OF ELECTRON
92, 192 FLOW OF HOLE
193 CARRIER CONCENTRATION REGION

What is claimed is:

1. A semiconductor device in which an insulated gate bipolar transistor having a MOS gate structure and a circuit including a MOSFET having a MOS gate structure configured to control the insulated gate bipolar transistor are provided on a first-conductivity-type semiconductor substrate that is the same first-conductivity-type semiconductor substrate, comprising:
    a first element portion in which the insulated gate bipolar transistor is arranged;
    a second element portion in which the circuit is arranged;
    a second-conductivity-type drift region that is provided on a front surface of the first-conductivity-type semiconductor substrate;
    a first-conductivity-type region that is provided in a surface layer of the second-conductivity-type drift region which is opposite to the first-conductivity-type semiconductor substrate;
    an insulator layer that is inserted between the MOS gate structure of the insulated gate bipolar transistor and the MOS gate structure of the MOSFET, that passes through the first-conductivity-type region in a depth direction and reaches the second-conductivity-type drift region, the insulator layer being provided at a boundary between the first element portion and the second element portion, and separating the first-conductivity-type region into a first first-conductivity-type region which is arranged in the first element portion and has an emitter potential of the insulated gate bipolar transistor and a second first-conductivity-type region which is arranged in the second element portion; and
    a first contact electrode that comes into contact with the second first-conductivity-type region, and that is electrically connected to an emitter electrode of the insulated gate bipolar transistor.

2. The semiconductor device according to claim 1, wherein the circuit includes an insulated gate semiconductor element having a base region and the second first-conductivity-type region comes into contact with the base region of the insulated gate semiconductor element forming the circuit.

3. The semiconductor device according to claim 2, wherein the second first-conductivity-type region surrounds the insulated gate semiconductor element.

4. The semiconductor device according to claim 3, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

5. The semiconductor device according to claim 2, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

6. The semiconductor device according to claim 1, further comprising a resistor that is connected between the second first-conductivity-type region and the first contact electrode.

7. The semiconductor device according to claim 1, further comprising a second contact electrode that is provided in an outer circumferential portion of the first-conductivity-type semiconductor substrate so as to surround the first element portion and the second element portion and that has an emitter potential that is the same as that of the insulated gate bipolar transistor.

8. The semiconductor device according to claim 7, wherein the second contact electrode has an outer circumferential end and the insulator layer has an end that is arranged inside the outer circumferential end of the second contact electrode.

9. The semiconductor device according to claim 8, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

10. The semiconductor device according to claim 7, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

11. The semiconductor device according to claim 1, wherein the second first-conductivity-type region has an end, and wherein the insulator layer has an end that extends from the end of the second first-conductivity-type region in an outer circumferential direction.

12. The semiconductor device according to claim 11, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

13. The semiconductor device according to claim 1, wherein the second-conductivity-type drift region and the first-conductivity-type semiconductor substrate have an interface, wherein the insulator layer has an end which is close to the first-conductivity-type semiconductor substrate, and wherein a distance between the end of the insulator layer and the interface between the second-conductivity-type drift region and the first-conductivity-type semiconductor substrate is equal to or greater than a diffusion length of a hole.

14. The semiconductor device according to claim 13, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

15. The semiconductor device according to claim 1, wherein the second-conductivity-type drift region has a thickness, wherein the second-conductivity-type drift region and the first-conductivity-type semiconductor substrate have an interface, wherein the insulator layer has an end which is close to the first-conductivity-type semiconductor substrate, and wherein a distance between the end of the insulator layer and the interface of the second-conductivity-type drift region and the first-conductivity-type semiconductor substrate is equal to or greater than half of the thickness of the second-conductivity-type drift region.

16. The semiconductor device according to claim 15, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

17. The semiconductor device according to claim 1, wherein the second-conductivity-type drift region and the first-conductivity-type semiconductor substrate have an interface, wherein the insulator layer has an end which is close to the semiconductor first-conductivity-type, and wherein a distance between the end of the insulator layer and the interface between the second-conductivity-type drift region and the first-conductivity-type semiconductor substrate is equal to or less than a diffusion length of a hole.

18. The semiconductor device according to claim 17, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

19. The semiconductor device according to claim 1, wherein the second-conductivity-type drift region has a thickness, wherein the second-conductivity-type drift region and the first-conductivity-type semiconductor substrate have an interface, wherein the insulator layer has an end which is close to the semiconductor first-conductivity-type, and wherein a distance between the end of the insulator layer and the interface between the second-conductivity-type drift region and the first-conductivity-type semiconductor substrate is equal to or less than half of the thickness of the second-conductivity-type drift region.

20. The semiconductor device according to claim 19, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

21. The semiconductor device according to claim 1, wherein the insulated gate bipolar transistor operates as a switch that controls the flow of a low-voltage current to a primary coil of an ignition coil of an internal-combustion engine ignition device to ignite an air-fuel mixture so that the semiconductor device is an igniter.

* * * * *